United States Patent
Hanawa et al.

(10) Patent No.: US 9,178,180 B2
(45) Date of Patent: Nov. 3, 2015

(54) DISPLAY DEVICE AND ELECTRONIC APPARATUS

(71) Applicant: JOLED INC., Tokyo (JP)

(72) Inventors: Kohji Hanawa, Kanagawa (JP); Nobuo Ozawa, Kanagawa (JP); Hiroyuki Ikeda, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/472,778

(22) Filed: Aug. 29, 2014

(65) Prior Publication Data

US 2015/0097168 A1    Apr. 9, 2015

(30) Foreign Application Priority Data

Oct. 9, 2013   (JP) .................................. 2013-211719

(51) Int. Cl.
*H01L 51/52*   (2006.01)
*H01L 27/32*   (2006.01)

(52) U.S. Cl.
CPC .......... *H01L 51/5271* (2013.01); *H01L 27/326* (2013.01)

(58) Field of Classification Search
None
See application file for complete search history.

(56) References Cited

U.S. PATENT DOCUMENTS

| | | | |
|---|---|---|---|
| 2004/0070708 A1* | 4/2004 | Kurashina | 349/110 |
| 2007/0159099 A1* | 7/2007 | Takahashi et al. | 313/512 |
| 2009/0090911 A1* | 4/2009 | Choi et al. | 257/59 |
| 2011/0063535 A1* | 3/2011 | Chang et al. | 349/37 |
| 2012/0199831 A1* | 8/2012 | Fujikawa et al. | 257/49 |
| 2013/0059404 A1* | 3/2013 | Asami et al. | 438/30 |
| 2015/0017869 A1* | 1/2015 | Kwon et al. | 445/24 |
| 2015/0049282 A1* | 2/2015 | Kim et al. | 349/86 |

FOREIGN PATENT DOCUMENTS

JP    2012-174356    9/2012

* cited by examiner

*Primary Examiner* — Alexander Ghyka
(74) *Attorney, Agent, or Firm* — Michael Best & Friedrich LLP

(57) ABSTRACT

Provided is a display device, including: a plurality of pixels that are provided between a first substrate and a light-transparent second substrate, the plurality of pixels each including a light-reflective first electrode, an organic layer, and a light-transparent second electrode in order from the first substrate side, the organic layer including at least a light-emission layer; a first light-shielding layer that is provided in a region between the plurality of pixels on one side of the second substrate; and a second light-shielding layer that is provided between the first light-shielding layer and the first substrate, the second light-shielding layer facing at least part of the first light-shielding layer.

13 Claims, 22 Drawing Sheets

DISPLAY DEVICE AND ELECTRONIC APPARATUS

CROSS REFERENCE TO RELATED APPLICATIONS

This application claims the benefit of Japanese Priority Patent Application JP 2013-211719 filed on Oct. 9, 2013, the entire contents of which are incorporated herein by reference.

BACKGROUND

The present disclosure relates to a display device that includes organic electroluminescent elements, and to an electronic apparatus that includes the display device.

As an example of a flat panel display, a display device using organic electroluminescent (EL) elements has been developed. The display device may be broadly divided into those of an upper-surface-light-emission (top-emission) type and those of a lower-surface-light-emission (bottom-emission) type.

In the display device of the top-emission type, a black matrix layer is provided between pixels of, for example, R (red), G (green), B (blue), or W (white) in order to prevent light from mixing into adjacent pixels (for example, Japanese Unexamined Patent Application Publication No. 2012-174356).

SUMMARY

However, there is a problem of occurrence of color mixing even in a case that the black matrix layer is provided, and thereby image quality may be degraded.

It is desirable to provide a display device that makes it possible to restrain degradation in image quality accompanying high definition, and an electronic apparatus.

According to an embodiment of the present disclosure, there is provided a display device including: a plurality of pixels that are provided between a first substrate and a light-transparent second substrate, the plurality of pixels each including a light-reflective first electrode, an organic layer, and a light-transparent second electrode in order from the first substrate side, the organic layer including at least a light-emission layer; a first light-shielding layer that is provided in a region between the plurality of pixels on one side of the second substrate; and a second light-shielding layer that is provided between the first light-shielding layer and the first substrate, the second light-shielding layer facing at least part of the first light-shielding layer.

According to an embodiment of the present disclosure, there is provided an electronic apparatus provided with a display device. The display device includes: a plurality of pixels that are provided between a first substrate and a light-transparent second substrate, the plurality of pixels each including a light-reflective first electrode, an organic layer, and a light-transparent second electrode in order from the first substrate side, the organic layer including at least a light-emission layer; a first light-shielding layer that is provided in a region between the plurality of pixels on one side of the second substrate; and a second light-shielding layer that is provided between the first light-shielding layer and the first substrate, the second light-shielding layer facing at least part of the first light-shielding layer.

In the display device and the electronic apparatus according to the above-described embodiments of the present disclosure, light produced in the organic layer for each pixel emits upwards through the second substrate, and thereby image display is performed. The first light-shielding layer is provided in the region between the plurality of pixels, and the second light-shielding layer is provided facing at least part of the first light-shielding layer. Thus, even in a case that, for example, a pixel pitch is narrowed, light proceeding obliquely from each pixel is shielded by the first or the second light-shielding layer, and the light is prevented from entering an adjacent pixel.

According to the display device and the electronic apparatus of the above-described embodiments of the present disclosure, the light produced in the organic layer for each pixel emits upwards through the second substrate, and thereby image display is performed. The first light-shielding layer is provided between pixels, and the second light-shielding layer is provided facing at least part of the first light-shielding layer. Hence, it becomes easier to keep the light from entering the adjacent pixel even in a case that a pixel pitch is narrowed. Thus, it is possible to restrain, for example, color mixing or the like. It is therefore possible to restrain degradation in image quality accompanying high definition.

It is to be noted that the contents above are an example of the present disclosure. Effects of the present disclosure are not limited to those described above, and may be other different effects, or may further include other effects.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 16 is a plan view illustrating an overall configuration of a module including the display device illustrated in FIG. 1 and so on.

DETAILED DESCRIPTION

In the following, some embodiments of the present disclosure will be described in detail with reference to the accompanying drawings. It is to be noted that description will be made in the following order.

1. Embodiment (one example of a display device that includes a light-shielding layer on a second electrode, the light-shielding layer facing a black matrix layer)
2. Modification Example 1 (one example in which a light-shielding layer is formed by offset printing)
3. Modification Example 2 (one example in which a high-resistivity layer is formed between an organic layer and the second electrode)
4. Modification Example 3 (one example in which a light-shielding layer is provided between the high-resistivity layer and the second electrode)
5. Application Example (Examples of electronic apparatuses)

<Embodiment>
[Configuration]

Figure 1:
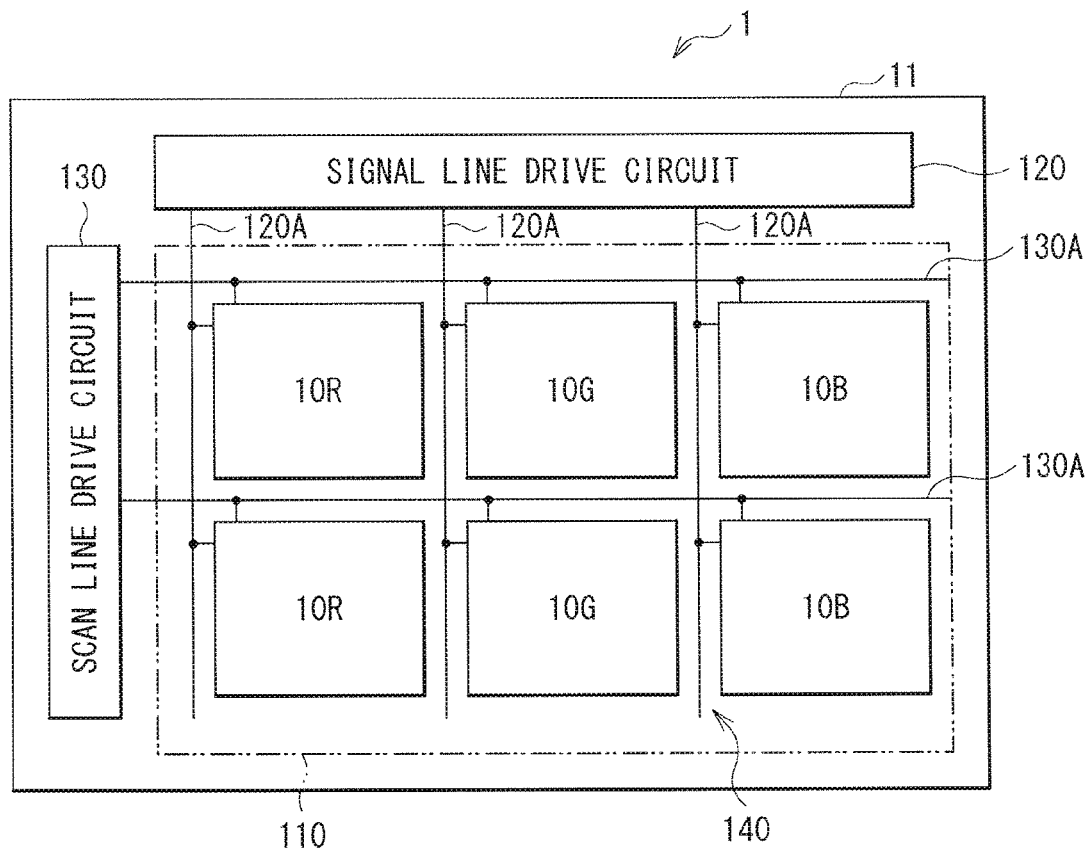
FIG. 1 illustrates a configuration of a display device according to an embodiment of the present disclosure.

FIG. 1 illustrates a configuration of a display device (a display device 1) according to an embodiment of the present disclosure. The display device 1 is an organic EL display device, and includes a display area 110 on a first substrate 11, in which a plurality of organic EL elements 10R, 10G, and 10B as a plurality of pixels are arrayed in a matrix. The organic EL elements 10R, 10G, and 10B are configured to produce red light LR (of a wavelength of 620 nm to 750 nm both inclusive), green light LG (of a wavelength of 495 nm to 570 nm both inclusive), and blue light LB (of a wavelength of 450 nm to 495 nm both inclusive), respectively. The organic EL elements 10R, 10G, and 10B each corresponds to a sub-pixel (an R pixel, a G pixel, and a B pixel, respectively). A unit of the three pixels, that is, the R pixel, the G pixel, and the B pixel, configures one pixel, with which image display is performed. In a periphery of the display area 110, provided are a signal line drive circuit 120 and a scan line drive circuit 130 for picture display.

Figure 2:
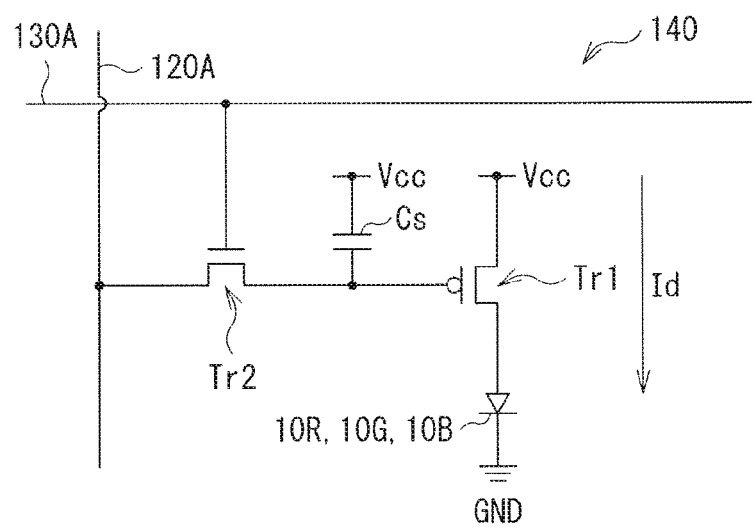
FIG. 2 illustrates one example of a pixel drive circuit illustrated in FIG. 1.

In the display area 110, for example, provided is a drive circuit of an active type (pixel drive circuit 140). The pixel drive circuit 140 includes, as illustrated in FIG. 2, a transistor Tr1 for driving and a transistor Tr2 for writing, with a capacitor Cs provided between the transistors Tr1 and Tr2. Between a first power supply line (Vcc) and a second power supply line (GND), the organic EL element 10R (or the organic EL element 10G or 10B) is connected in series with the transistor Tr1. The signal line drive circuit 120 is configured to supply image signals to source electrodes of the transistors Tr2 through a plurality of signal lines 120A arranged in a column direction. The scan line drive circuit 130 is configured to supply in order scan signals to gate electrodes of the transistors Tr2 through a plurality of scan lines 130A arranged in a row direction.

Figure 3:
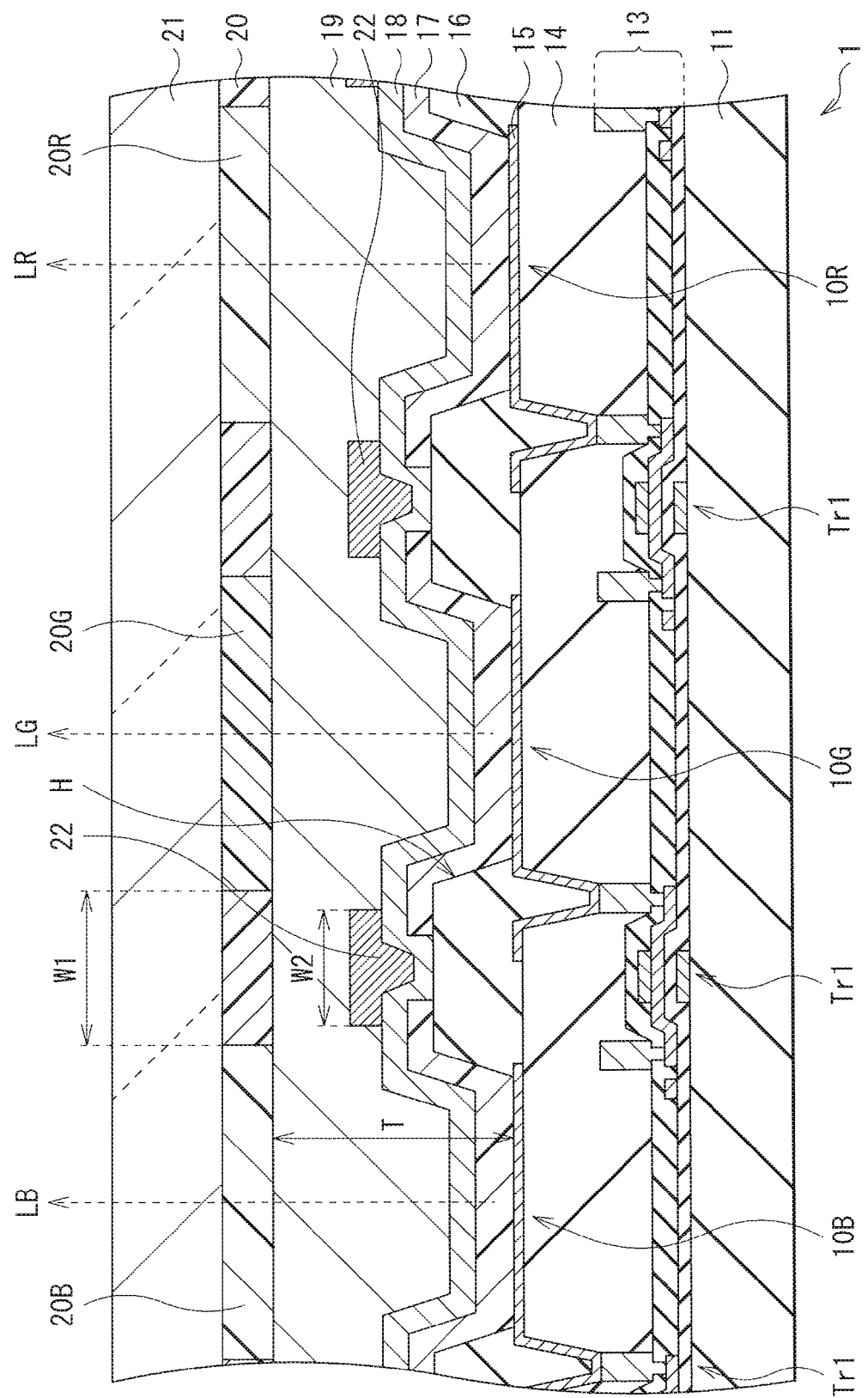
FIG. 3 is a cross-sectional view illustrating a configuration of the display device illustrated in FIG. 1.

FIG. 3 illustrates in section a configuration of the display device illustrated in FIG. 1. It is to be noted that FIG. 3 illustrates a region corresponding to the organic EL elements 10R, 10G, and 10B. The organic EL elements 10R, 10G, and 10B are provided between the first substrate 11 and a second substrate 21. On the first substrate 11, provided is a drive circuit layer 13 including the pixel drive circuit 140 that is configured to drive each of the organic EL elements 10R, 10G, and 10B. A planarization film 14 is formed to cover the drive circuit layer 13. On the planarization film 14, provided is a first electrode 15, for example, as an anode. The first electrode 15 is electrically connected to the transistor Tr1 provided in the drive circuit layer 13.

In the organic EL elements 10R, 10G, and 10B, the first electrode 15, an inter-pixel insulating film 16, an organic layer 17 including a light-emission layer, and a second electrode 18, for example, as a cathode are laminated in the order from the first substrate 11 side. Above the organic EL elements 10R, 10G, and 10B, the second substrate 21 is bonded with a sealing layer 19 in between. On the second substrate 21, formed are color filter layers (22G, 22G, and 22B) and a black matrix layer 20 (a first light-shielding layer).

The display device 1 is an organic EL display device of a so-called top-emission type (upper-surface-light-emission type), in which, for example, light produced in the organic layer 17 is extracted from the second electrode 18 side. Moreover, in an example illustrated in FIG. 3, the organic layer 17 includes the light-emission layer that produces light of different colors for each of the organic EL elements 10R, 10G, and 10B. In the following, description is given on a configuration of each component.

The first substrate 11 is configured of, for example, glass, a silicon (Si) wafer, a resin or a conductive substrate and so on. The conductive substrate may be used, for example, with its surface insulated by silicon oxide ($SiO_2$) or a resin.

In the drive circuit layer 13, for example, pixel transistors such as the above-described transistors Tr1 and Tr2, the capacitor Cs, and so on are formed, but herein only the transistor Tr1 among them is illustrated. The transistor Tr1 is a thin film transistor (TFT), for example, of a bottom gate type, and is configured of a metal oxide semiconductor field effect transistor (MOSFET). In the transistor Tr1, on the first substrate 11, a gate electrode that is patterned, for example, with an insulating film in between, a gate insulating film, a semiconductor thin film that constitutes a channel, and an interlayer insulating film are laminated in the order. A source electrode and a drain electrode are formed adjacent to the respective ends of the semiconductor layer. To the drain electrode of the transistor Tr1, the first electrode 15 is electrically connected. It is to be noted that the transistor Tr1 is not limited to that of a bottom gate type, but may be that of a top gate type. The semiconductor thin film may be configured of crystalline silicon or amorphous silicon, or may be configured of oxide semiconductor.

The planarization film 14 contributes to planarization of a surface of the first substrate 11 on which the drive circuit layer 13 is formed, and allows each layer of the organic EL elements 10R, 10G, and 10B to be formed with a uniform thickness. The planarization film 14 is provided with a contact hole that connects the first electrode 15 and the drain electrode of the transistor Tr1, and has a function of preventing them from coming into unintended contact. Examples of constituent materials of the planarization film 14 include organic materials such as a polyimide resin, an acrylic resin, and a novolac resin, or inorganic materials such as silicon oxide ($SiO_2$), silicon nitride (SiNx) or silicon oxynitride (SiON).

The first electrode 15 is provided to be electrically insulated for each pixel, and has light-reflectivity. The first electrode 15 preferably has as high light-reflectivity as possible for improving light emission efficiency. Since the first electrode 15 serves as an anode, the first electrode 15 is preferably configured of a material having high hole-injection ability. A thickness in a direction of lamination (hereinafter simply referred to as a thickness) of the first electrode 15 is, for example, 30 nm to 1000 nm both inclusive. Examples of constituent materials of the first electrode 15 include a single substance or an alloy of metal elements such as chromium (Cr), gold (Au), platinum (Pt), nickel (Ni), copper (Cu), molybdenum (Mo), tungsten (W), titanium (Ti), tantalum (Ta), or silver (Ag) and so on. On a surface of the first electrode 15, a transparent conductive film such as an oxide of indium and tin (ITO) may be provided. The thickness of the first electrode 15 may be appropriately set so as to balance wiring resistance against light-reflectivity (surface roughness).

Other than the above-described materials, a single substance or an alloy of aluminum may be used. Aluminum has high light-reflectivity, but a surface oxide film may be formed, or a hole injection barrier may be formed due to a low work function. However, it may be used as the first electrode 15 by providing an appropriate hole injection layer. The first electrode 15 may be a single-layer film or a layered film of a single substance or an alloy of the above-mentioned metals.

The inter-pixel insulating film 16 is configured to electrically separate the first electrode 15 for each pixel, and ensure insulation between the first electrode 15 and the second electrode 18. The inter-pixel insulating film 16 has a hole H to face each of the first electrodes 15, and defines a light-emission area of each of the organic EL elements 10R, 10G, and 10B. The inter-pixel insulating film 16 is configured of an insulating material such as, for example, silicon oxide or polyimide.

The organic layer 17 includes the light-emission layer, and may also include for example, a hole transport layer (HTL), a hole injection layer (HIL), and an electron transport layer (ETL).

The light-emission layer is configured to produce light by recombination of an electron and a hole in response to an electric field applied. The light-emission layer is configured of, for example, different materials for each of the organic EL elements 10R, 10G, and 10B. In the organic EL element 10R, formed is a red light-emission layer that is configured to produce red light. In the organic EL element 10G, provided is a green light-emission layer that is configured to produce green light. In the organic EL element 10B, provided is a blue light-emission layer that is configured to produce blue light. However, this configuration is not limitative, but the organic EL elements 10R, 10G, and 10B may commonly include the red light-emission layer, the green light-emission layer, and the blue light-emission layer to allow white light to be produced. In this case, the color filter layers 22R, 22G, and 22B allow the white light to be separated into red light, green light, and blue light.

The red light-emission layer is configured to produce red light by recombination of part of holes injected from the first electrode 15 and part of electrons injected from the second electrode 18 in response to an electric field applied. The red light-emission layer includes, for example, at least one of a red light-emission material, a hole transport material, an electron transport material, and a both charge transport material. The red light-emission material may be fluorescent or phosphorescent. For example, the red light-emission layer has a thickness of about 5 nm, and is configured of a mixture in which 30 wt % of 2,6-bis[(4'-methoxydiphenylamino)styril]-1,5-dicyanonaphthalene (BSN) is mixed in 4,4'-bis(2,2-diphenylvinyl)biphenyl (DPVBi).

The green light-emission layer is configured to produce green light by recombination of part of holes injected from the first electrode 15 and part of electrons injected from the second electrode 18 in response to an electric field applied. The green light-emission layer includes, for example, at least one of a green light-emission material, a hole transport material, an electron transport material, and a both charge transport material. The green light-emission material may be fluorescent or phosphorescent. For example, the green light-emission layer has a thickness of about 10 nm, and is configured of a mixture in which 5 wt % of coumarin is mixed in DPVBi.

The blue light-emission layer is configured to produce blue light by recombination of part of holes injected from the first electrode 15 and part of electrons injected from the second electrode 18 in response to an electric field applied. The blue light-emission layer includes, for example, at least one of a blue light-emission material, a hole transport material, an electron transport material, and a both charge transport material. The blue light-emission material may be fluorescent or phosphorescent. For example, the blue light-emission layer has a thickness of about 30 nm, and is configured of a mixture in which 2.5 wt % of 4,4'-bis[2-{4-(N,N-diphenylamino)phenyl}vinyl]biphenyl (DPAVBi) is mixed in DPVBi.

The hole transport layer is configured to improve hole injection efficiency into the light-emission layer for each color, and may also serve as a hole injection layer. For example, the hole transport layer has a thickness of about 40 nm, and is configured of 4,4',4"-tris (3-methylphenylphenylamino)triphenylamine (m-MTDATA), or α-naphtylphenyldiamine (aNPD). For example, the electron transport layer has a thickness of about 20 nm, and is configured of 8-hydroxyquinolinealuminum ($Alq_3$).

Further, between the organic layer 17 and the second electrode 18, an electron injection layer (EIL) may be provided. The electron injection layer is a mixed layer of an electron transport organic material and a metal material having a low work function. The electron transport organic material is, for example, 8-hydroxyquinolinealuminum ($Alq_3$). The metal material is, for example, magnesium (Mg), calcium (Ca), lithium (Li), and so on. Alternatively, the electron injection layer may be configured of an alloy in which at least two materials of metals such as magnesium, calcium, lithium, aluminum and silver and so on are mixed. A thickness of the electron injection layer is, for example, 1 nm to 10 nm both inclusive.

The second electrode 18 has light-transmittance, and for example, provided over an entire surface of the display area, commonly to the organic EL elements 10R, 10G, and 10B. The second electrode 18 is configured of, for example, a transparent conductive film such as indium tin oxide (ITO), zinc oxide (ZnO), alumina-doped zinc oxide (AZO), gallium-oxide-doped zinc oxide (GZO), indium zinc oxide (IZO) or indium titanium oxide (ITiO) and so on. A thickness of the second electrode 18 is, for example, 5 nm to 1000 nm both inclusive, preferably 5 nm to 200 nm both inclusive. The second electrode 18 may be formed, for example, by sputtering.

The sealing layer 19 includes a protective layer, an adhesive layer, and so on. The protective layer is made of, for example, silicon nitride, silicon oxide, or metal oxide. The adhesive layer is made of, for example, a thermosetting resin or an ultraviolet curing resin.

The second substrate 21 is configured of a material that is transparent to light produced in the organic EL elements 10R, 10G, and 10B, specifically glass and so on. On one surface (for example, a surface on the first substrate 11 side) of the second substrate 21, the color filter layers 22R, 22G, and 22B, and the black matrix layer 20 are provided.

The black matrix layer 20 has light-shielding property, and for example, has apertures to face the respective light-emission areas of the organic EL elements 10R, 10G, and 10B. A plan configuration of the black matrix layer 20 (a plan configuration parallel to a main surface of the second substrate 21) is, for example, in a lattice shape. A width W1 is, for example, 3 um to 30 um both inclusive. A thickness is, for example, 0.5 um to 3 um. Inside the apertures of the black matrix layer 20, the color filter layers 22R, 22G, and 22B are formed. The color filter layer 22R is provided to face the organic EL element 10R, and is configured to selectively allow red light to pass through. The color filter layer 22G is provided to face the organic EL element 10G, and is configured to selectively allow green light to pass through. The color filter layer 22B is provided to face the organic EL element 10B, and is configured to selectively allow blue light to pass through.

The black matrix layer 20 and the color filter layers 22R, 22G, and 22B may be provided either on a surface on a light-incident side (an element side) or on a surface on a light-exit side of the second substrate 21. For example, they are provided on the surface on the light-incident side.

Figure 4:
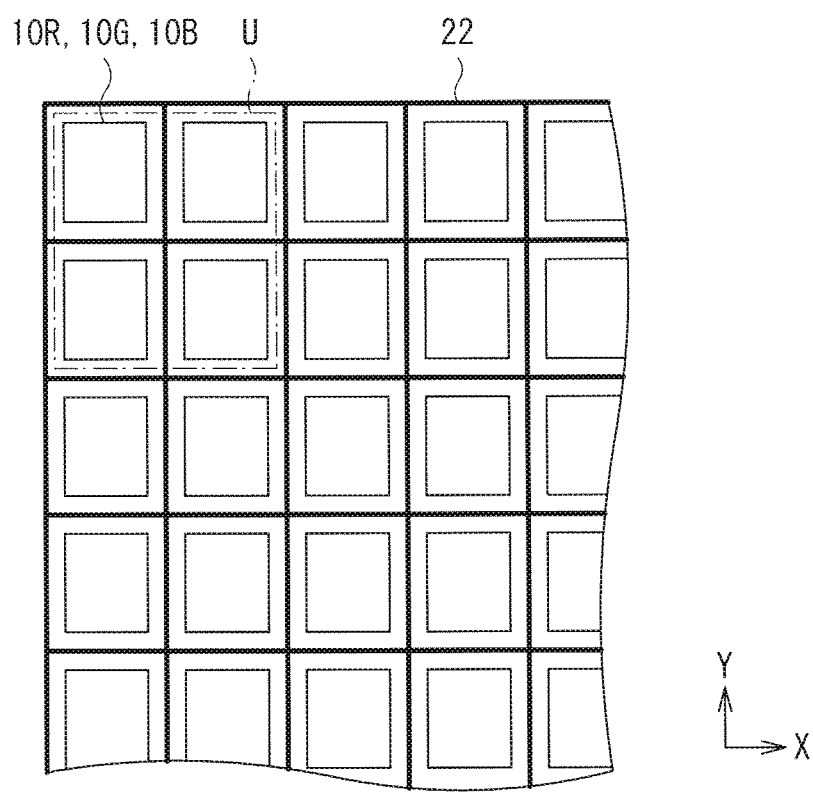
FIG. 4 is a schematic plan view illustrating one example of a light-shielding layer illustrated in FIG. 3, together with a pixel layout in a shape of a crossed square.
Figure 5A:
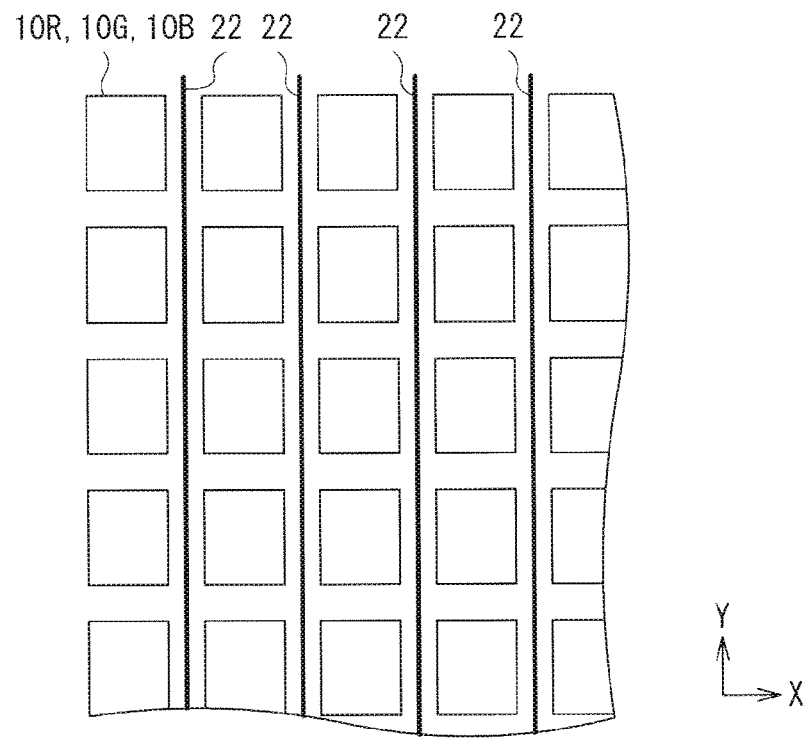
FIG. 5A is a schematic plan view illustrating another example of the light-shielding layer illustrated in FIG. 4.
Figure 5B:
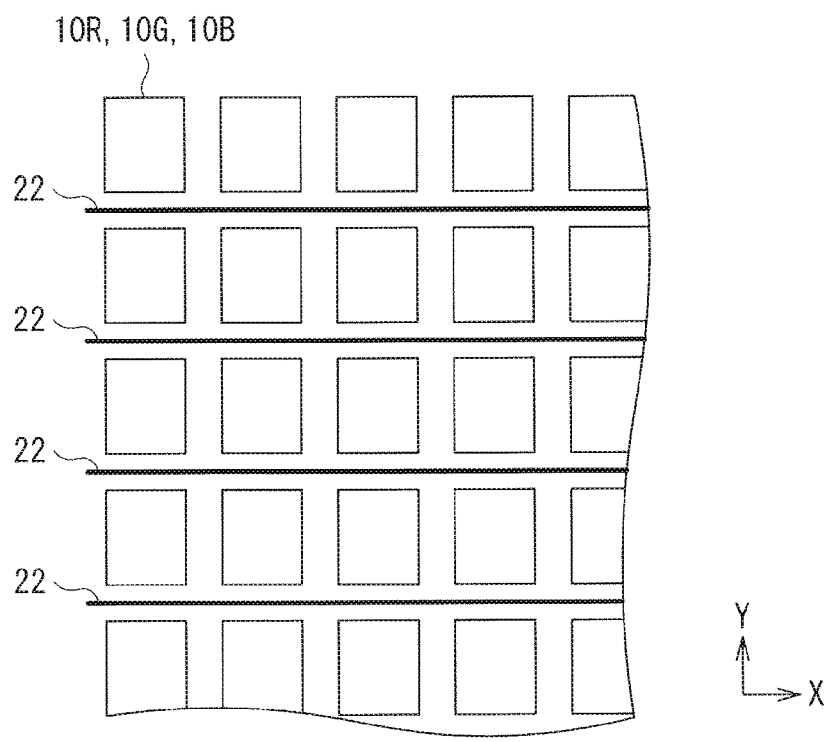
FIG. 5B is a schematic plan view illustrating another example of the light-shielding layer illustrated in FIG. 4.
Figure 5C:
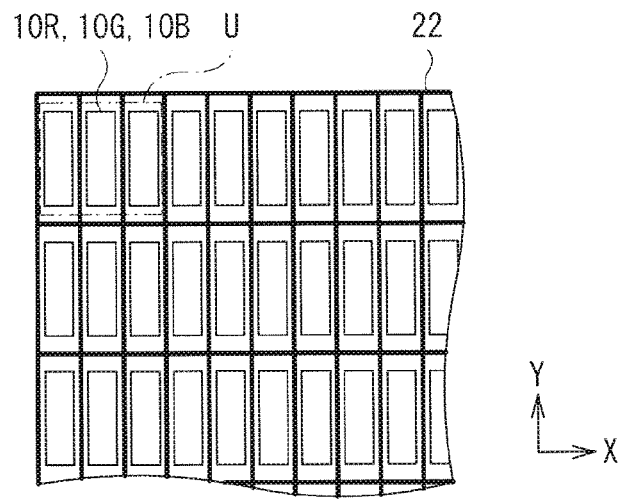
FIG. 5C is a schematic plan view illustrating one example of the light-shielding layer illustrated in FIG. 3, together with a pixel layout in a stripe shape.

In the embodiment, in the above-described configuration, a layer having a light-shielding property (a light-shielding layer 22 (a second light-shielding layer)) is provided between the first substrate 11 and the black matrix layer 20. The light-shielding layer 22 is provided to face at least part of the black matrix layer 20. A width W2 of the light-shielding layer 22 is, for example, 3 um to 30 um both inclusive. A thickness is, for example, 0.05 um to 1 um both inclusive. Herein, the light-shielding film 22 is provided on the second electrode 18 and has a plan configuration in a lattice shape as schematically illustrated in FIG. 4. Specifically, the light-shielding layer 22 is formed to surround each of the light-emission areas of the organic EL elements 10R, 10G, and 10B. It is to be noted that an example is given here in which the organic EL elements 10R, 10G, and 10B as the subpixels are arranged in a shape of a crossed square (a layout in which four subpixels in two rows and two columns constitute one pixel (a display unit) U). In an alternative, the light-shielding layer 22 is not limited to the lattice shape, but may be provided in a stripe shape as illustrated in FIGS. 5A and 5B. Also, the layout of the light-shielding layer 22 is not limited to the examples as described above, but may be provided selectively in a region between adjacent pixels that are configured to emit lights of relatively close wavelengths, for example.

Figure 5D:
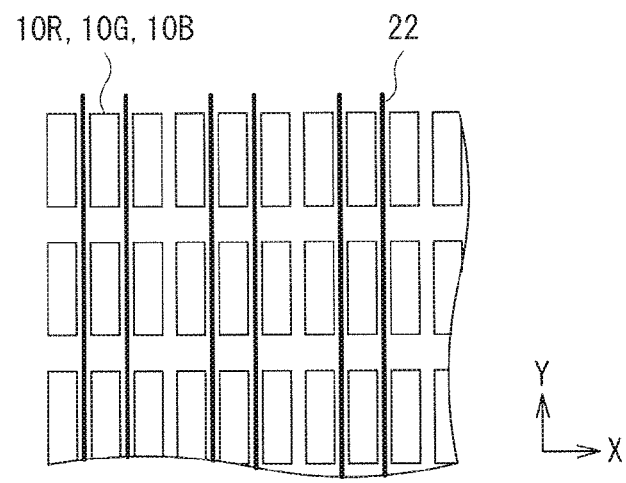
FIG. 5D is a schematic plan view illustrating another example of the light-shielding layer illustrated in FIG. 5C.
Figure 5E:
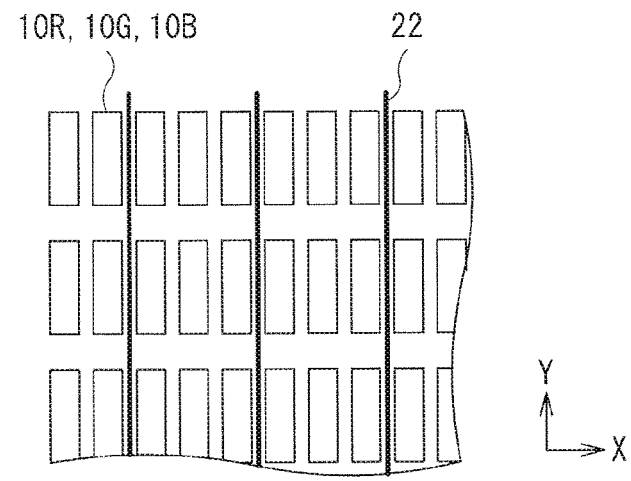
FIG. 5E is a schematic plan view illustrating another example of the light-shielding layer illustrated in FIG. 5C.
Figure 5F:
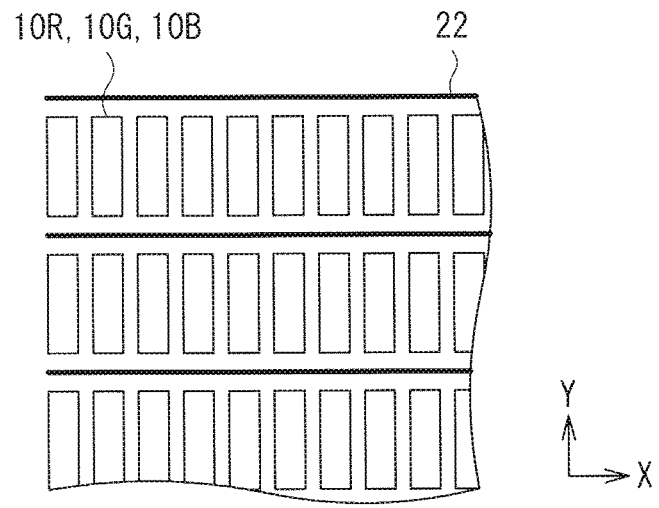
FIG. 5F is a schematic plan view illustrating another example of the light-shielding layer illustrated in FIG. 5C.

The layout of the subpixels is not limited to the shape of a crossed square as mentioned above, but may be in a stripe shape (that is, a layout in which rectangular subpixels aligned in line constitute the one pixel U). FIGS. 5C to 5F illustrate one example thereof. In this case, the layout of the light-shielding layer 22 may be in a lattice shape (FIG. 5C) or in a stripe shape (FIGS. 5D to 5F). Alternatively, as illustrated in FIGS. 5D and 5E, the light-shielding layer 22 may be provided in a selective row between adjacent pixels that are configured to emit lights of relatively close wavelengths, for example. Here, "between adjacent pixels that are configured to emit lights of relatively close wavelengths" may refer to, for example, between the organic EL elements 10G and 10B (for example, FIG. 5E). Alternatively, "between adjacent pixels that are configured to emit lights of relatively close wavelengths" may refer to, for example, between the organic EL elements 10G and 10B, and between the organic EL elements 10R and 10G (for example, FIG. 5D).

Figure 5G:
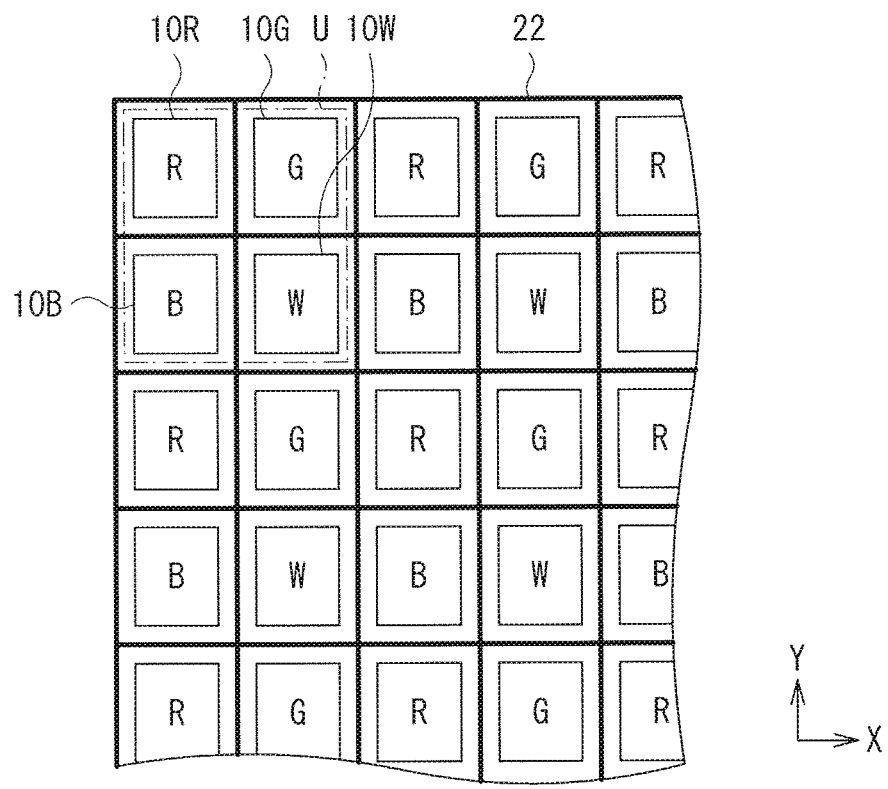
FIG. 5G is a schematic plan view illustrating one example of a light-shielding layer in a case that a W pixel is used.

Further, the three-pixel configuration of R, G, and B (the organic EL elements 10R, 10G, and 10B) is not limitative. It is possible to adopt a four-pixel configuration in which a white (W) subpixel (an organic EL element 10W) is added. In FIG. 5G, an example thereof is given (in an array of a crossed square). In this case, preferably, the above-mentioned light-shielding layer 22 is provided to surround the W pixel, since in the W pixel image quality is easily influenced due to color mixing with other colors.

The light-shielding layer 22 may be formed in a desired region as described above, for example, by printing. Examples of printing include various methods such as screen printing, reverse offset printing, gravure printing, and inkjet printing. As a constituent material of the light-shielding film 22, a material applicable to such printing techniques, specifically an ink including a conductive material may be used. Examples of conductive inks include a metal ink dispersed with nano-sized silver, aluminum or copper (Cu) and so on. By using such conductive materials, high light-shielding property is obtained.

Figure 6:
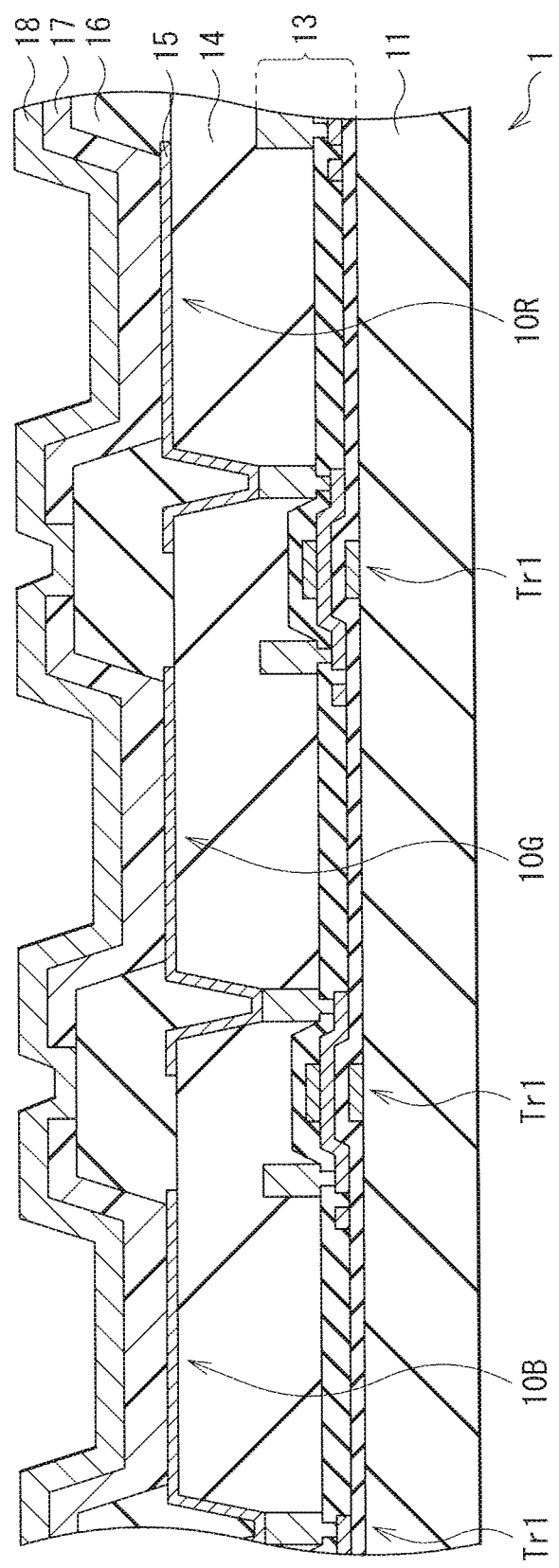
FIG. 6 is a cross-sectional view illustrating a method of manufacturing the display device illustrated in FIG. 3.
Figure 7:
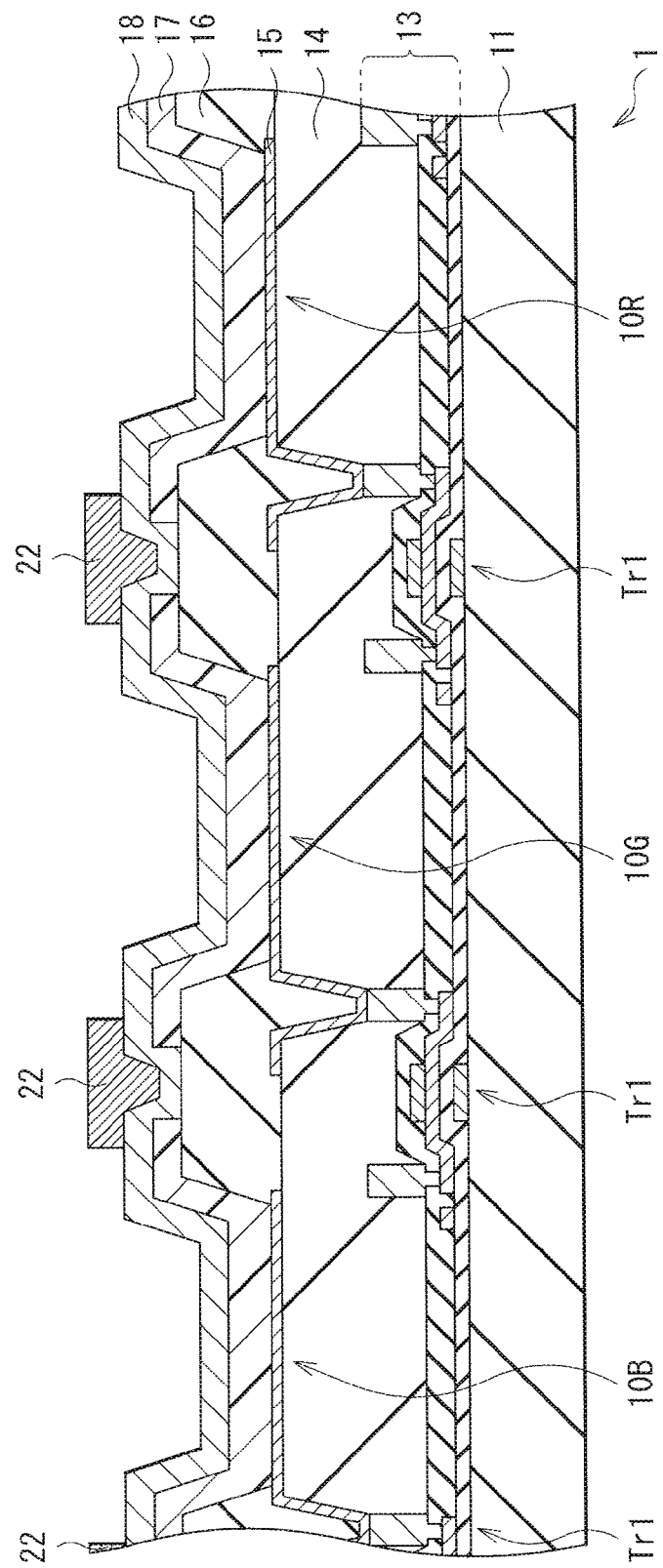
FIG. 7 is a cross-sectional view illustrating a process following FIG. 6.

Specifically, as illustrated in FIG. 6, on the first substrate 11, the drive circuit layer 13, the planarization layer 14, the first electrode 15, the inter-pixel insulating layer 16, the organic layer 17, and the second electrode 18 are formed (that is, the organic EL elements 10R, 10G, and 10B are formed). Then, as illustrated in FIG. 7, using the above-mentioned various printing methods, on the second electrode 18, the light-shielding layer 22 is formed. At this time, the above-mentioned metal ink is coated on the second electrode 18, and then baking is carried out at a predetermined temperature, thereby the light-shielding layer 22 is formed. It is to be noted that the light-shielding layer 22 is preferably formed in an environment where moisture content is small, such as in the dry air or in a nitrogen atmosphere. It is to be noted that as a method of forming the light-shielding layer 22, printing is preferable in consideration of high definition, but a method other than printing, for example, deposition is also adoptable. In this way, on the first substrate 11, the organic EL elements 10R, 10G, and 10B and the light-shielding layer 22 are formed. Subsequently, the second substrate 21 having the black matrix layer 20 and the color filter layers 22R, 22G, and 22B is bonded with the sealing layer 19 in between.

[Operations and Functions]

In the display device 1 according to the embodiment, as illustrated in FIGS. 1 and 2, the scan signal is supplied by the scan line drive circuit 130 to the gate of the transistor Tr2 of each pixel, while the image signal is supplied by the signal line drive circuit 120 through the transistor Tr2 to the capacitor Cs, which stores the signal. The transistor Tr1 is on/off controlled in response to the signal stored by the capacitor Cs, thereby a drive current Id is injected to each of the organic EL elements 10R, 10G, and 10B. The drive current Id is injected in the light-emission layer of the organic layer 17 through the first electrode 15 and the second electrode 18, allowing light to be produced by recombination of holes and electrons.

Red light, green light, and blue light are produced in the organic EL elements 10R, 10G, and 10B, respectively. The lights of respective colors are repeatedly reflected, for example, between the first electrode 15 and the second electrode 18, and pass through the second electrode 18, the color filter layers 22R, 22G, and 22B, and the second substrate 21, to be emitted upward above the second substrate 21. Thus, image display is performed with a unit of the organic EL elements 10R, 10G, and 10B that emit the lights of respective colors R, G, and B as the one pixel.

Figure 8:
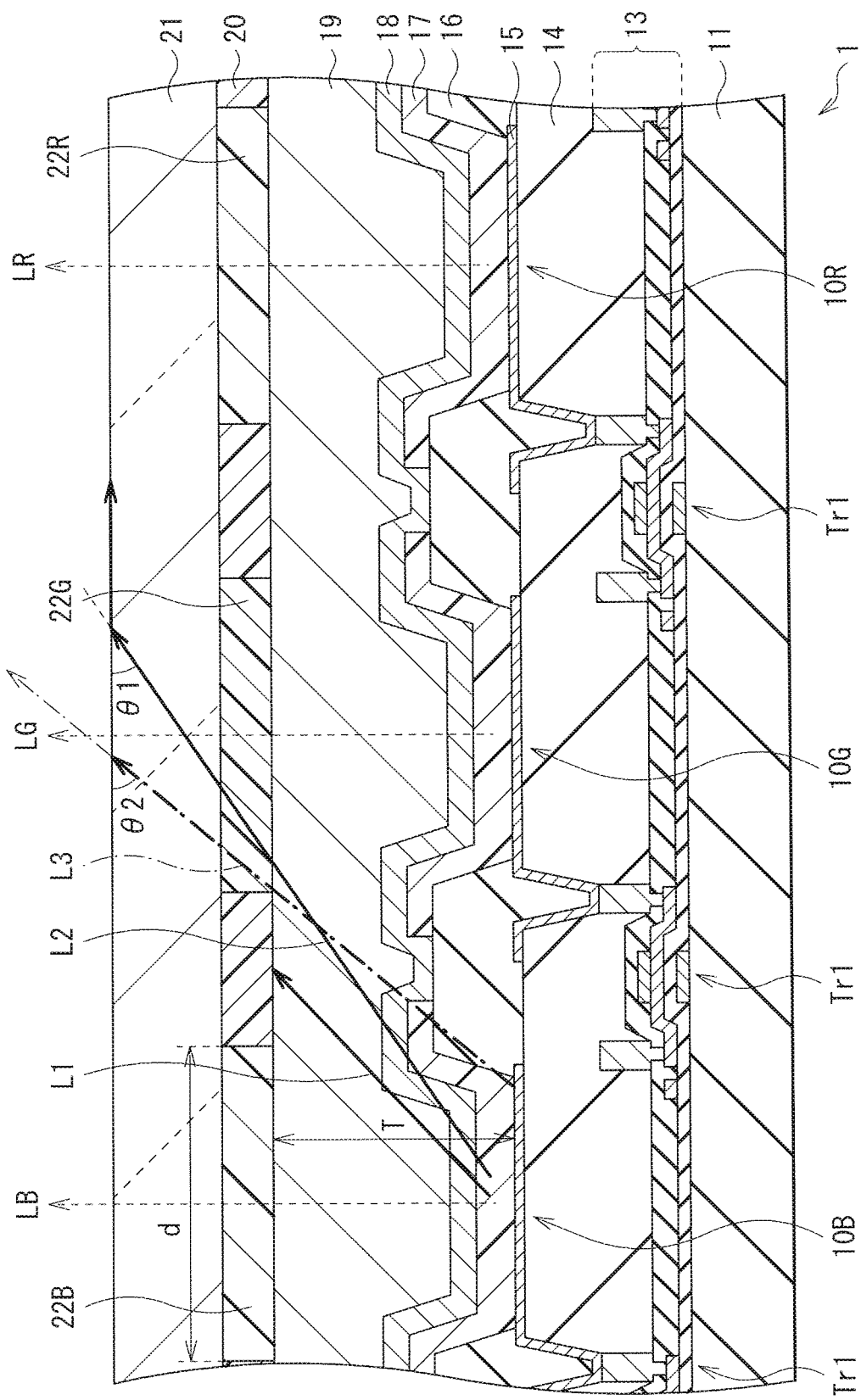
FIG. 8 is an explanatory schematic diagram illustrating a function of a display device according to a comparative example.

At this time, in the above-described display device of the top-emission type, the light produced in the organic layer 17 has angle distribution. Consequently, as illustrated in FIG. 8, there occurs lights (L1 to L3) proceeding obliquely (toward an adjacent pixel) from the organic layer 17 of, for example, the organic EL element 10B that emits blue light. Among them, a light L1 is shielded by the black matrix layer 20. On the other hand, depending on an angle at which the lights are emitted, there may occur lights L2 and L3 that enter the adjacent pixel (the G pixel) without being shielded by the black matrix layer 20.

Figure 9:
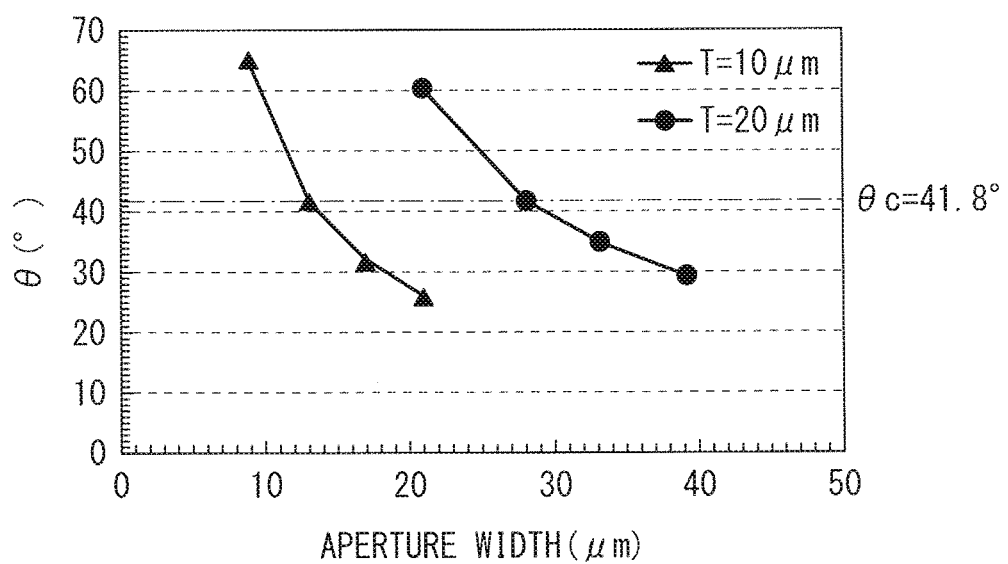
FIG. 9 is a characteristics diagram illustrating a relationship of an incident angle at an interface between a second substrate and an air layer illustrated in FIG. 8 with respect to an aperture width.

FIG. 9 illustrates a relationship of an aperture width (an aperture width of the black matrix layer 20) d and an incident angle θ at an interface between the second substrate 21 and an air layer, with a gap (a distance between the first electrode 15 and the black matrix layer 20) T being 10 um and 20 um. Thus, there is a tendency that the incident angle θ increases as the aperture width d is narrowed. Even a light that enters the adjacent pixel as the light L2 is not emitted upward above the second substrate 21 because of total reflection, when the incident angle θ1 at the interface is equal to or smaller than a critical angle θc. In other words, the blue light L2 produced in the organic EL element 10B is not emitted through the adjacent G pixel. Thus, it is preferable that the black matrix layer 20 is designed to shield the light (L1) proceeding toward the adjacent pixel, while the incident angle at the interface satisfies a total reflection condition in a case of occurrence of the light (L2) entering the adjacent pixel.

However, as illustrated in FIG. 9, when the aperture width d is narrowed, that is, in attaining high definition of the pixels, the incident angle θ increases. It becomes therefore difficult to design a layout of the black matrix layer 20 so as to satisfy the above-mentioned total reflection condition. For example, when the critical angle θc at the interface between the second substrate 21 (for example, made of glass; having a refractive index of 1.5) and the air (having a refractive index of 1.0) is 41.8°, and the gap T is, for example, 10 um, if the aperture width d is narrowed to be equal to or less than 13 um, there occurs the light (L3) that enters the interface at an incident angle θ2 greater than the critical angle θc. Alternatively, when the critical angle θc at the interface between the second substrate 21 (having a refractive index of 1.5) and the air (having a refractive index of 1.0) is 41.8°, and the gap T is, for example, 20 um, if the aperture width d is narrowed to be equal to or less than 28 um, there occurs the light (L3) that enters the interface at an incident angle θ2 greater than the critical angle θc. Thus, the blue light L3 is emitted through the adjacent G pixel, causing color mixing.

Figure 10:
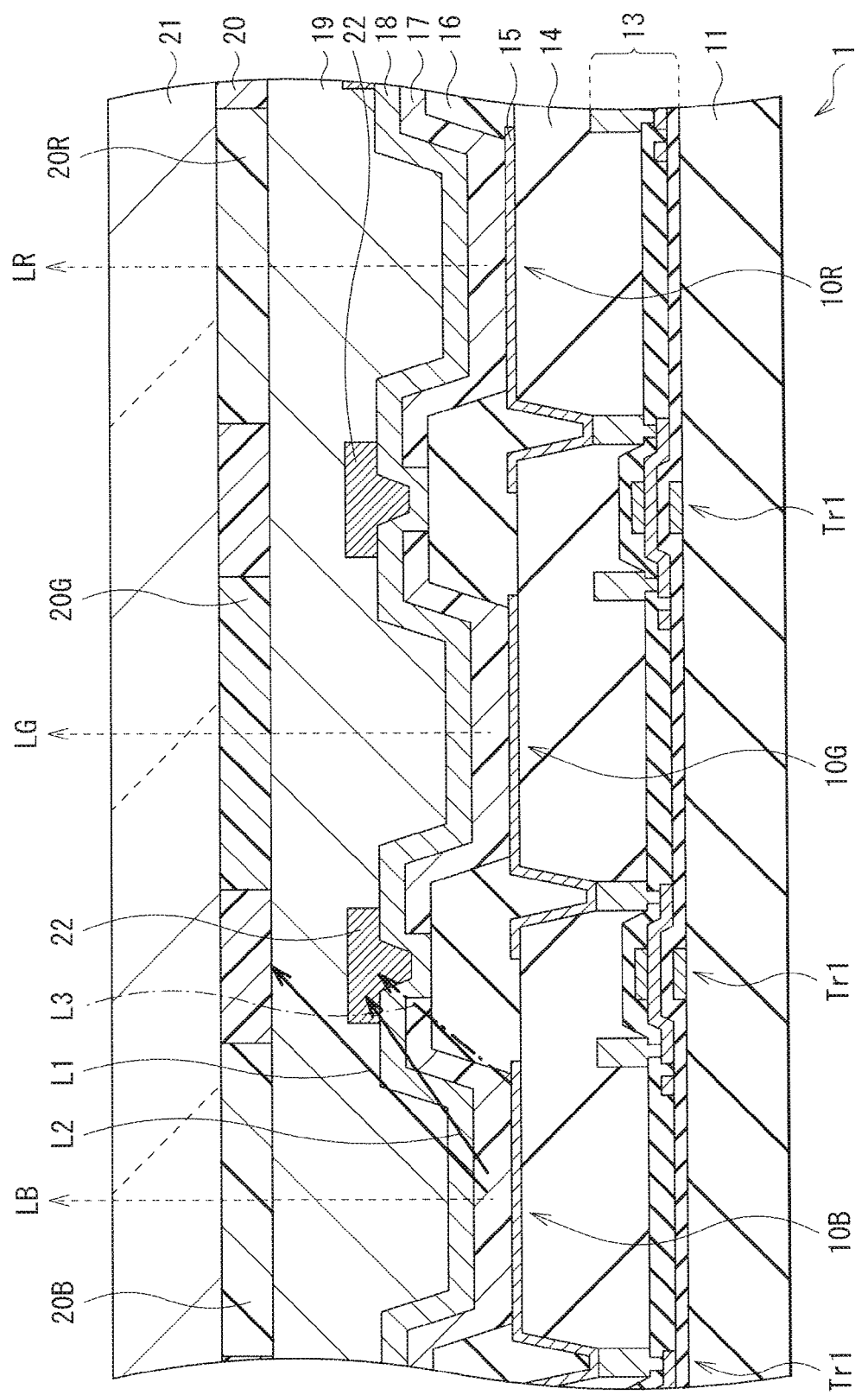
FIG. 10 is an explanatory schematic diagram illustrating a function of the display device illustrated in FIG. 3.

In the embodiment, between the black matrix layer 20 and the first substrate 11, the light-shielding layer 22 is provided. Thus, as illustrated in FIG. 10, it is possible to shield the lights L2 and L3 as described above. Accordingly, it is possible to restrain light leakage into the adjacent pixels while attaining high definition. Thereby, it is possible to restrain occurrence of color mixing as described above.

As described above, in the embodiment, the light produced in the organic layer 17 for each pixel is emitted upwards above the second substrate 21, and thereby image display is performed. The black matrix layer 20 is provided in a region between pixels, and the light-shielding layer 22 is provided to face at least part of the black matrix layer 20. It is therefore possible to shield the light proceeding obliquely from each pixel by the black matrix layer 20 or by the light-shielding layer 22 even in a case that a pixel pitch is narrowed. It is possible to prevent the light from entering the adjacent pixel, thereby restraining, for example, color mixing and so on. This makes it possible to restrain degradation in image quality accompanying high definition of pixels.

In the following, description is given on modification examples of the above-described embodiment. It is to be noted that similar components to the above-described embodiment are denoted by the same numerals, and description thereof is appropriately omitted.

Modification Example 1

Figure 11:
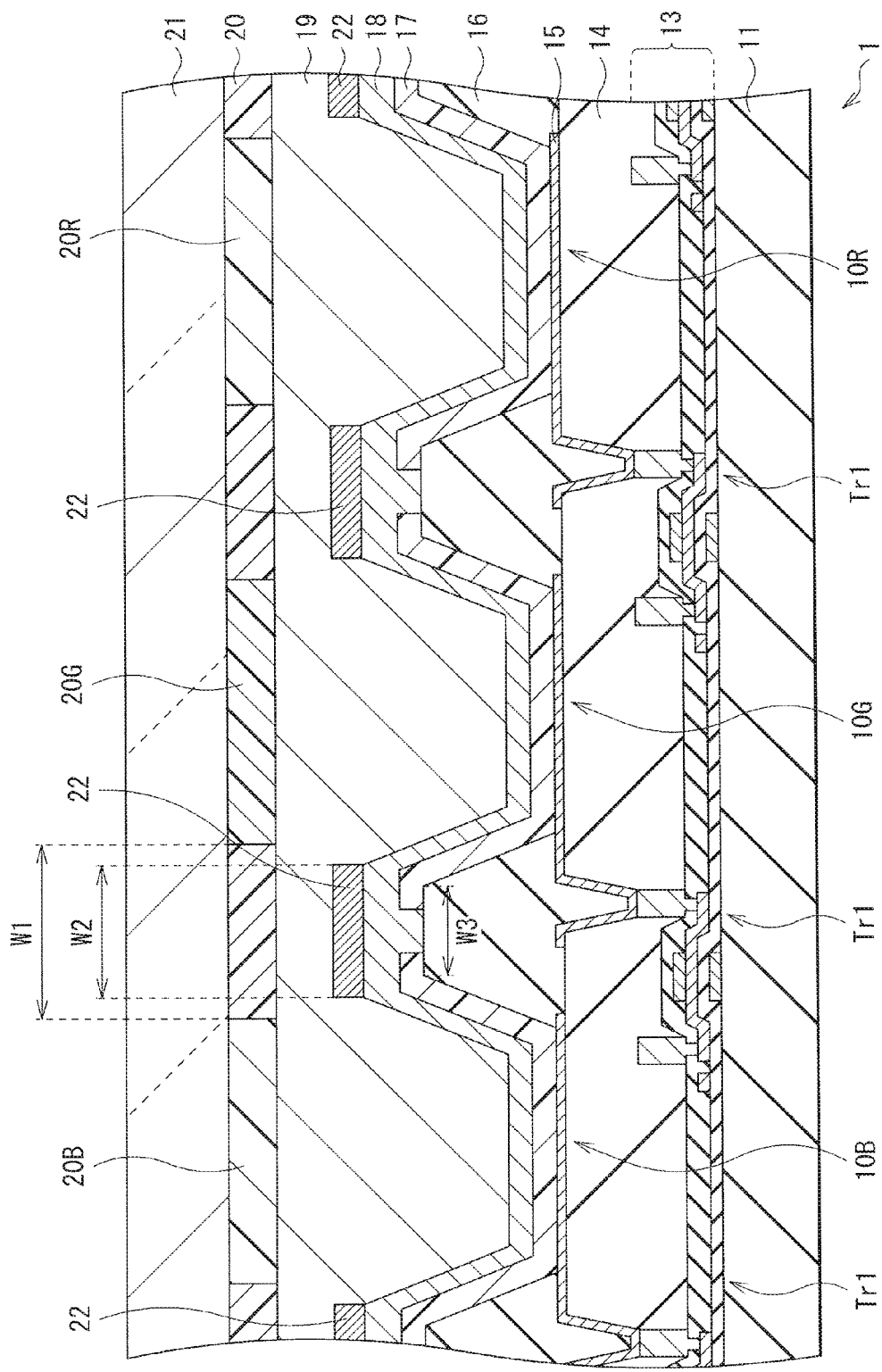
FIG. 11 is a cross-sectional view illustrating a configuration of a display device according to a modification example 1.

FIG. 11 illustrates in section a configuration of a display device according to a modification example 1. As mentioned in the above-described embodiment, the light-shielding film 22 is formed by various kinds of printing techniques. In the modification example, description is given especially on a case of offset printing. In this case, a width W3 of the inter-pixel insulating film 16 is set so that the width W2 of the light-shielding layer 22 is smaller than the width W1 of the black matrix layer 20 (W1 is equal to or greater than (≥) W2, and W2 is nearly equal to W3).

Figure 12:
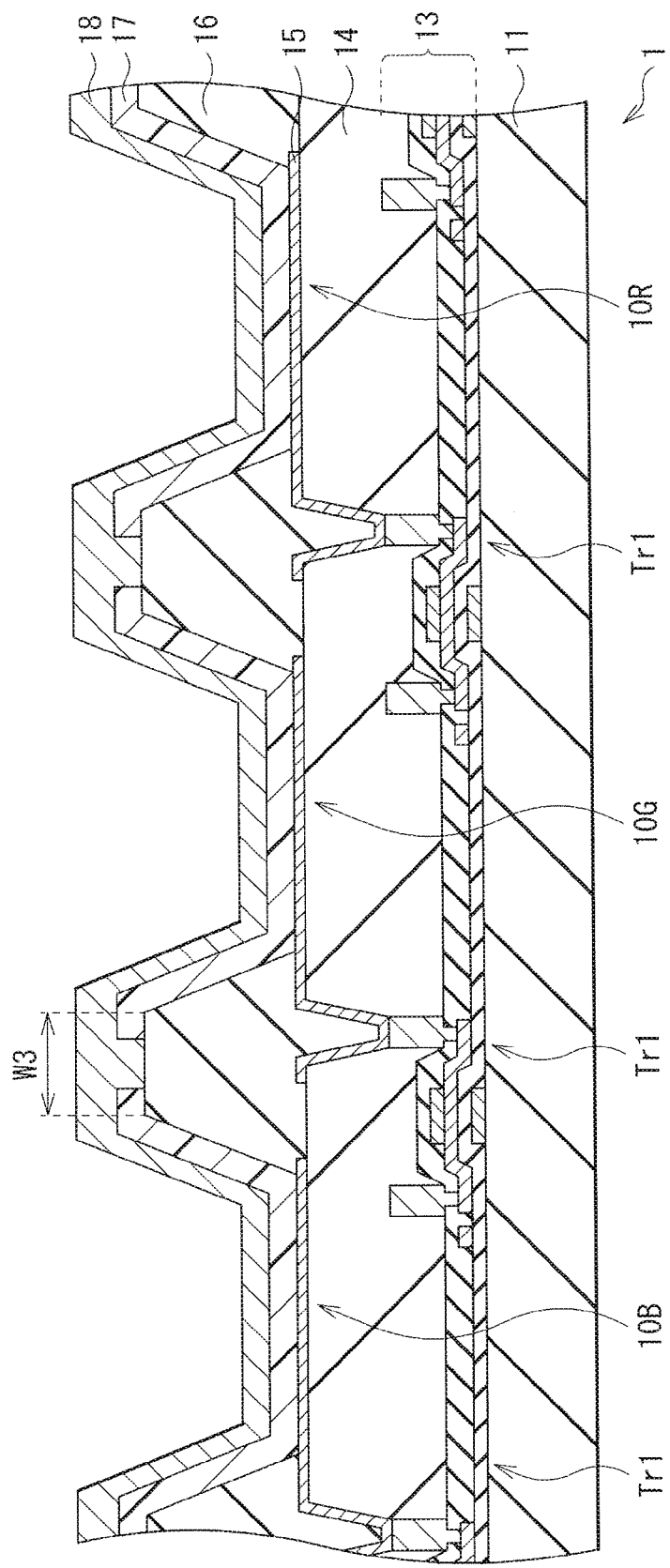
FIG. 12 is a cross-sectional view illustrating a method of manufacturing the display device illustrated in FIG. 11.
Figure 13:
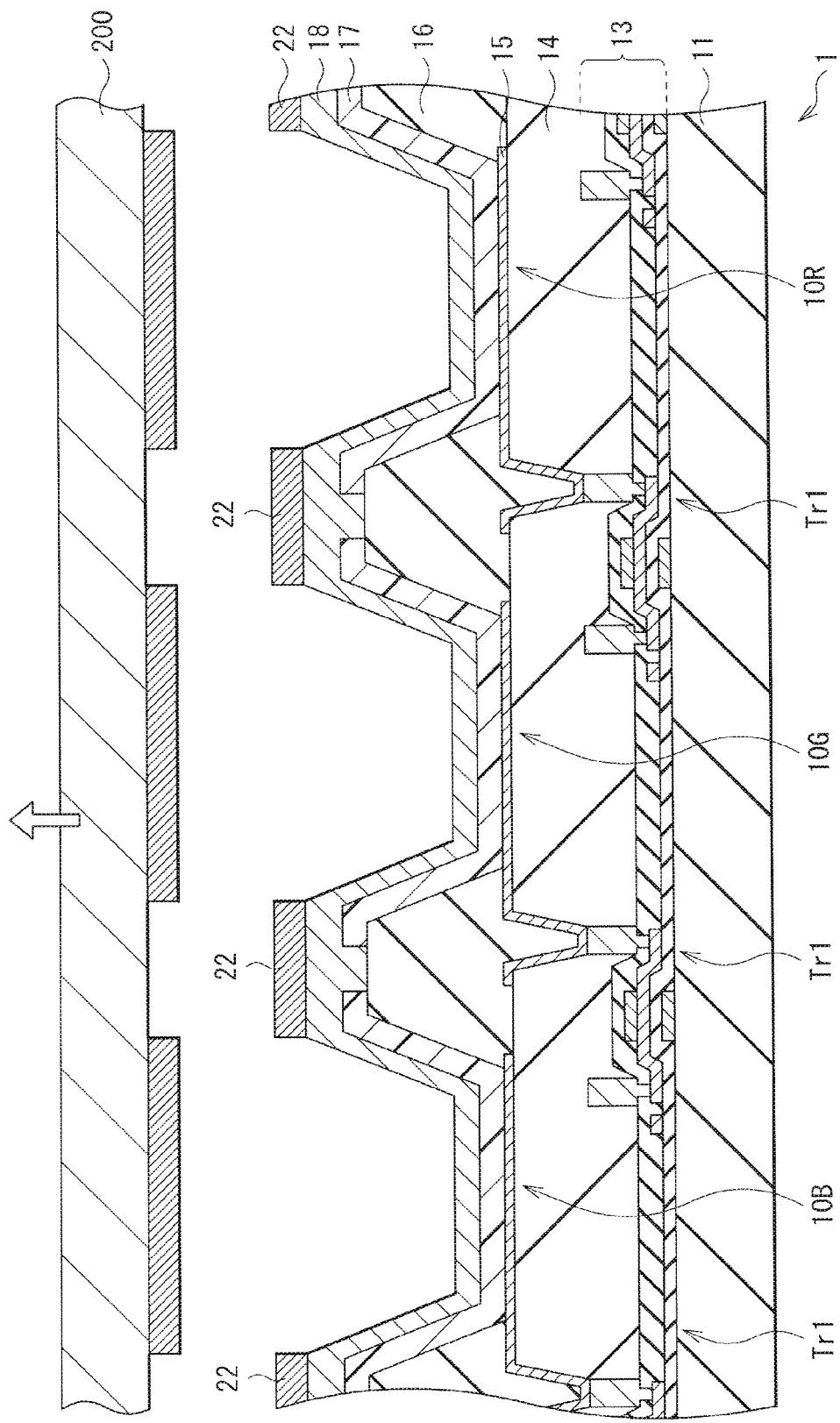
FIG. 13 is a cross-sectional view illustrating a process following FIG. 12.

Specifically, as illustrated in FIG. 12, the inter-pixel insulating film 16 is formed so that the width W3 is a predetermined value. Then, the organic layer 17 and the second electrode 18 are formed in this order. After that, as illustrated in FIG. 13, a plate 200 having a surface coated with the above-described light-shielding layer material is pressed to a surface on the second electrode 18 side of the first substrate 11, and then is separated. Thus, on the second electrode 18, the light-shielding layer 22 is formed.

As in the modification example, in a case that the light-shielding layer 22 is formed by offset printing, it is possible to form the light-shielding layer 22 utilizing unevenness of the inter-pixel insulating film 16.

Modification Example 2

Figure 14:
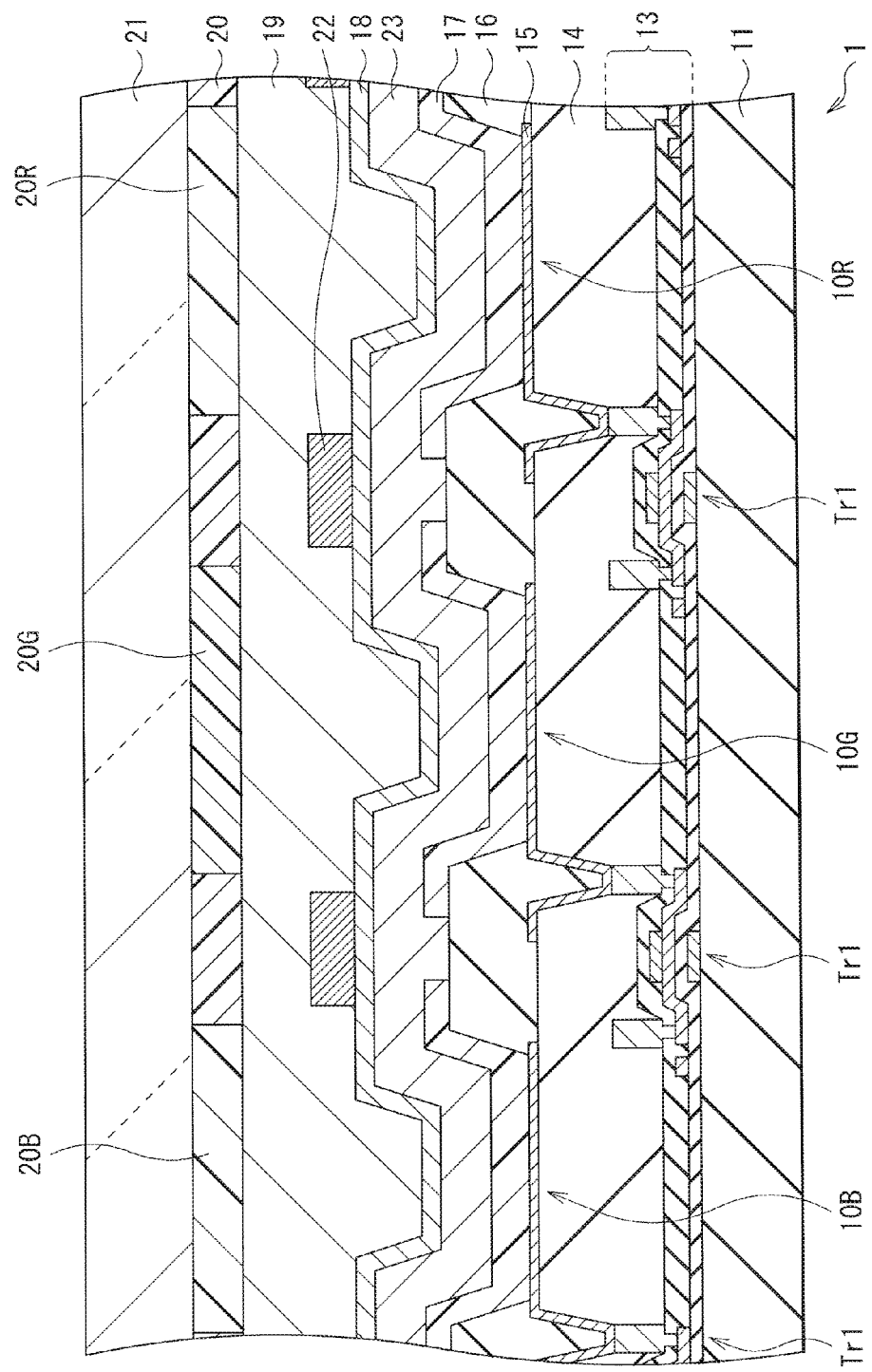
FIG. 14 is a cross-sectional view illustrating a configuration of a display device according to a modification example 2.

FIG. 14 illustrates in section a configuration of a display device according to a modification example 2. In the modification example, a high-resistivity layer 23 is interposed between the organic layer 17 and the second electrode 18. The high-resistivity layer 23 is configured of an inorganic material having light-transmittance. The high-resistivity layer 23 is provided to prevent a solvent from permeating through the organic layer 17 in a case that the light-shielding layer 22 is formed by printing as described above. The light-shielding layer 22 is provided on the second electrode 18, similarly to the above-described embodiment.

An example of a constituent material of the high-resistivity layer 23 includes niobium oxide ($Nb_2O_5$), titanium oxide ($TiO_2$), molybdenum oxide ($MoO_2$, $MoO_3$), tantalum oxide ($Ta_2O_5$), hafnium oxide (HfO), magnesium oxide (MgO), IGZO, a mixture of niobium oxide and titanium oxide, a mixture of titanium oxide and zinc oxide (ZnO), a mixture of silicon oxide ($SiO_2$) and tin oxide ($SnO_2$), or a combination of these materials. A thickness of the high-resistivity layer 23 is, for example, 100 nm to 2000 nm both inclusive. An example of a deposition method includes sputtering.

The high-resistivity layer 23 is provided, for example, between the organic layer 17 and the second electrode 18. This makes it possible to prevent the conductive ink from permeating through the organic layer 17 in a case that the light-shielding layer 22 is formed on the second electrode 18 by printing as described above. It is also possible to protect the organic layer 17 against moisture that remains in a slight amount in the dry air or in the nitrogen atmosphere during the printing process.

Modification Example 3

Figure 15:
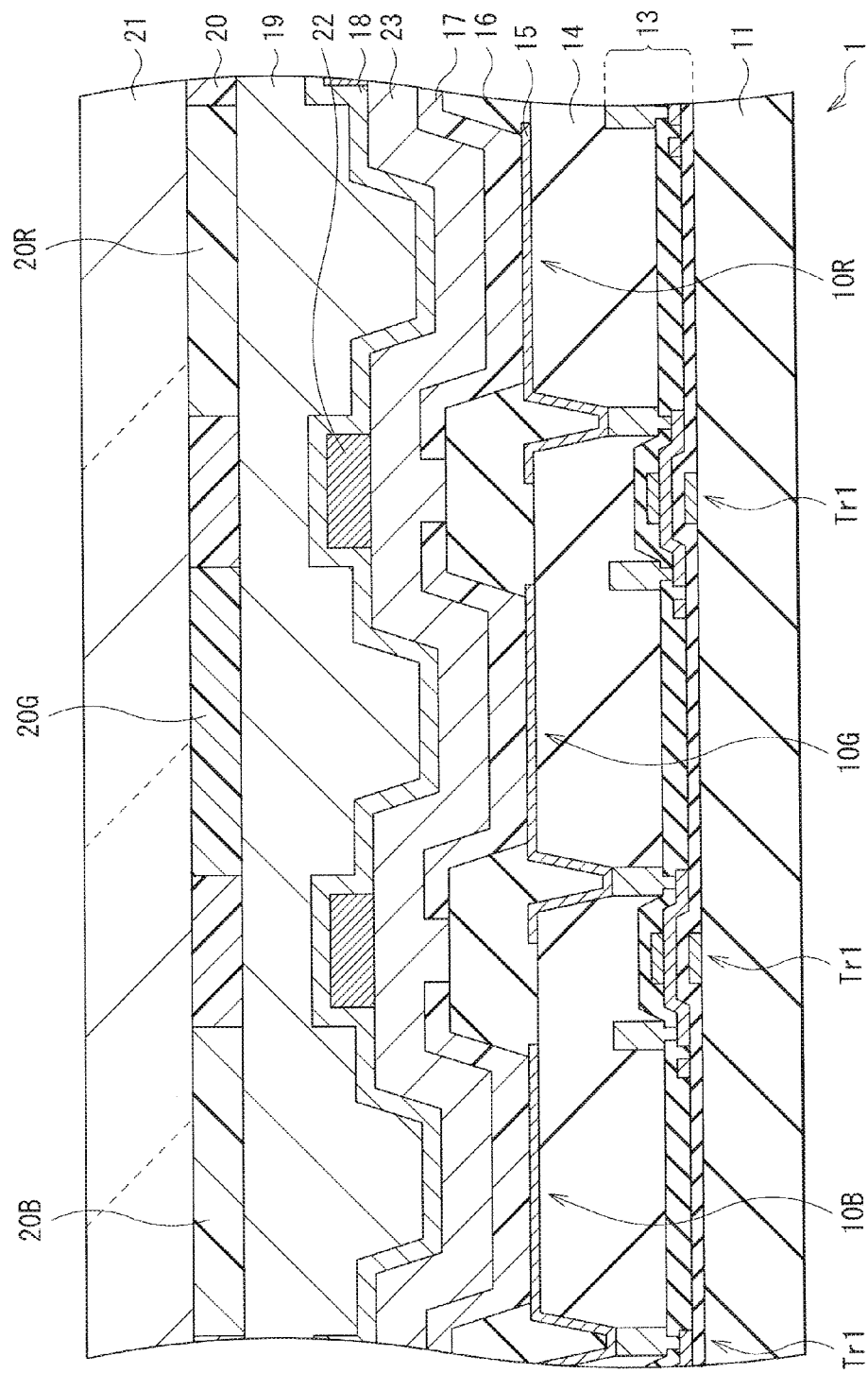
FIG. 15 is a cross-sectional view illustrating a configuration of a display device according to a modification example 3.

FIG. 15 illustrates in section a configuration of a display device according to a modification example 3. In the above-described embodiment and modification examples, the light-shielding layer 22 is provided, for example, on the second electrode 18. However, a location of the light-shielding layer 22 is not limited as long as it is provided between the black matrix layer 20 and the first substrate 11. As for example in the modification example, in an element configuration in which the high-resistivity layer 23 is provided between the organic layer 17 and the second electrode 18, the light-shielding layer 22 may be provided between the high-resistivity layer 23 and the second electrode 18.

Application Examples

Figure 16:
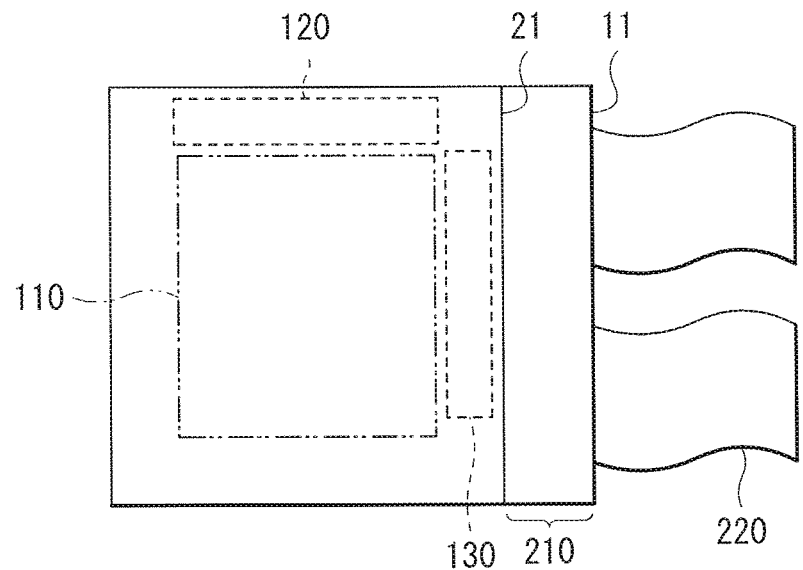

The display device as described in the above embodiment and modification examples may be applied to an electronic apparatus in various fields that is configured to display a picture based on a picture signal input from outside or a picture signal generated inside. The display device is incorporated, in a form of a module as illustrated in FIG. 16, in an electronic apparatus such as a television set, a digital camera, a video camera, a notebook personal computer, a mobile phone and a smart phone, which are exemplified in the following. In FIG. 16, on the first substrate 11, provided are the display area 110, and the signal line drive circuit 120 and the scan line drive circuit 130 as a peripheral circuit section. The display area 110 includes, for example, the subpixels (the above-described organic EL elements 10R, 10G, and 10B) arranged in a two-dimensional array. Along one side of the first substrate 11, provided is a region 210 exposed from the second substrate 21. In the region 210, provided are external connection terminals (not illustrated) that are extended from wirings of the signal line drive circuit 120 and the scan line drive circuit 130. On the external connection terminals, provided is a flexible printed circuit (FPC) 220 for signal input and output.

Figure 17:
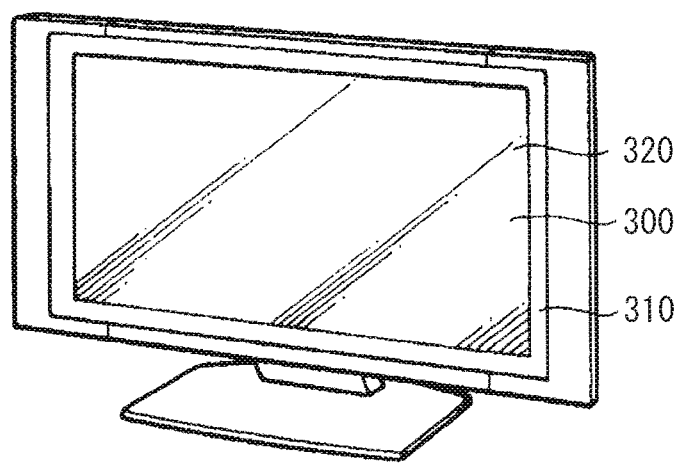
FIG. 17 is a perspective view illustrating a configuration of a television set.

FIG. 17 illustrates an appearance of a television set. The television set includes, for example, a picture display screen section 300 that includes a front panel 310 and a filter glass 320. The picture display screen section 300 is configured of the display device according to the above-described embodiment and so on.

Figure 18A:
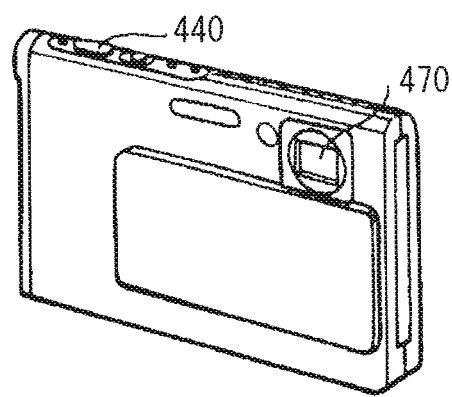
FIG. 18A is a perspective view illustrating a configuration of a digital still camera.
Figure 18B:
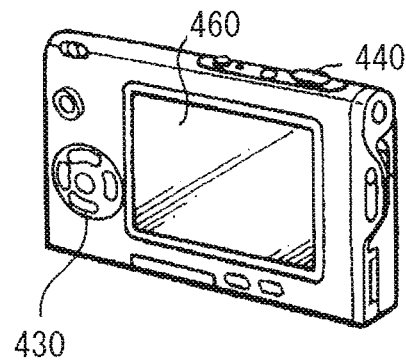
FIG. 18B is a perspective view illustrating a configuration of a digital still camera.

FIGS. 18A and 18B illustrate an appearance of a digital camera. The digital camera includes, for example, a lighting section for flash lighting 470, a display section 460, a menu switch 430, and a shutter button 440. The display section 460 is configured of the display device according to the above-described embodiment and so on.

Figure 19:
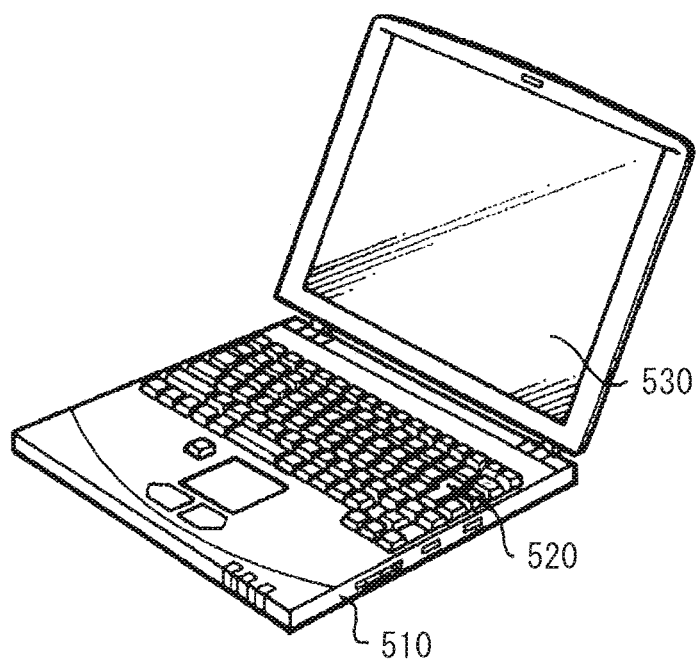
FIG. 19 is a perspective view illustrating an appearance of a personal computer.

FIG. 19 illustrates an appearance of a notebook personal computer. The notebook personal computer includes, for example, a main body 510, a keyboard 520 for input operations of characters and the like, and a display section 530 for image display. The display section 530 is configured of the display device according to the above-described embodiment and so on.

Figure 20:
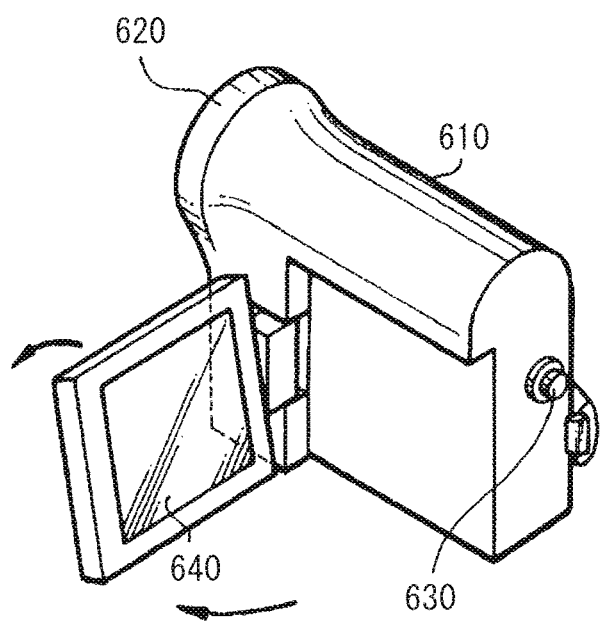
FIG. 20 is a perspective view illustrating an appearance of a video camera.

FIG. 20 illustrates an appearance of a video camera. The video camera includes, for example, a main body 610, a lens 620 for photographing an object, which is provided on a front side face of the main body 610, a start/stop switch 630 at the time of photographing, and a display section 640. The display section 640 is configured of the display device according to the above-described embodiment and so on.

Figure 21A:
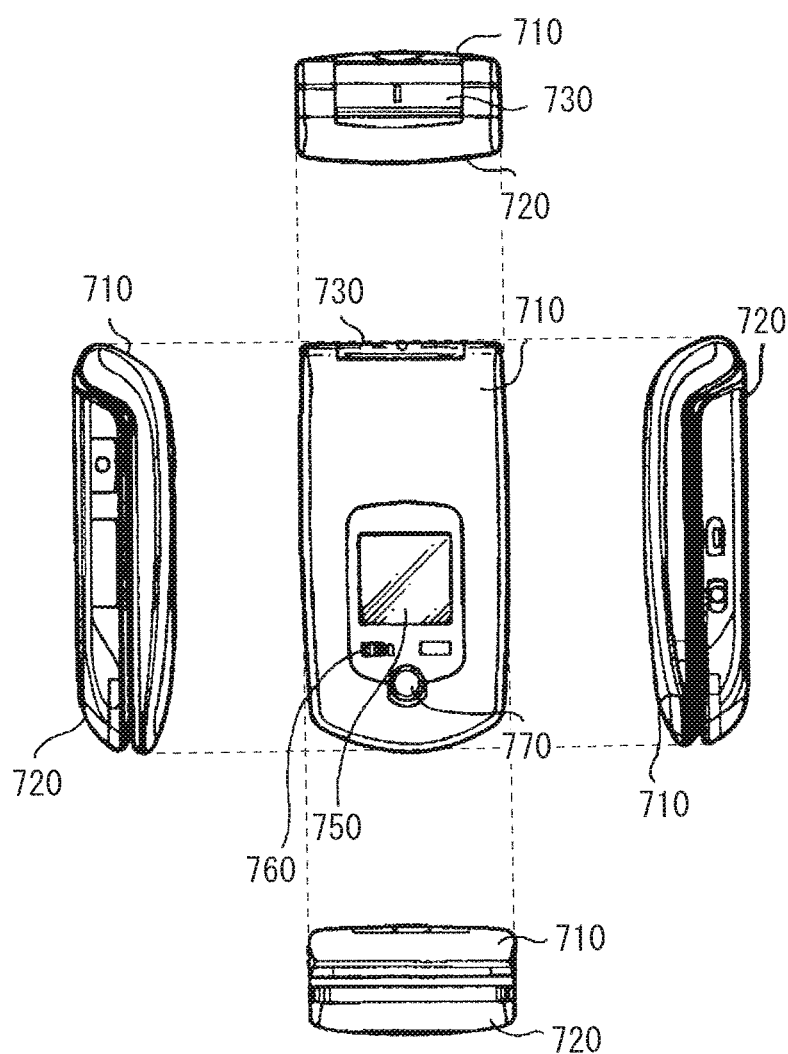
FIG. 21A is a plan view illustrating a configuration of a mobile phone.
Figure 21B:
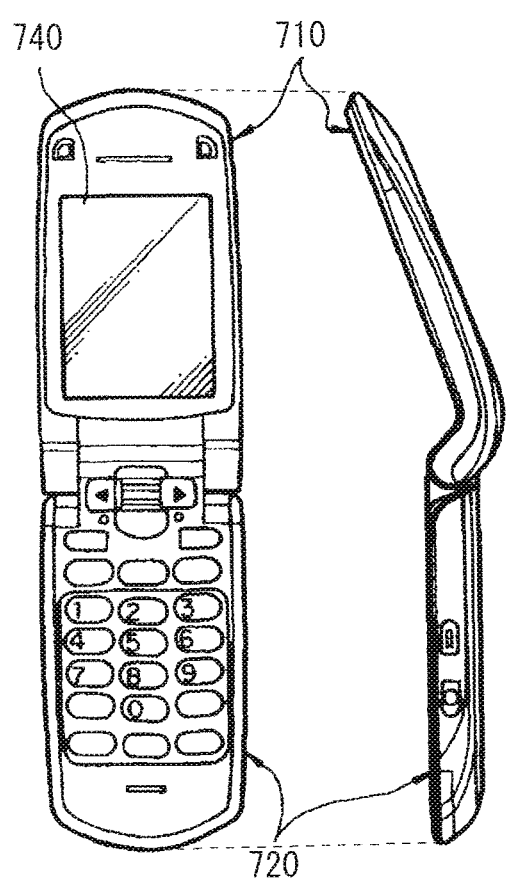
FIG. 21B is a plan view illustrating a configuration of a mobile phone.

FIGS. 21A and 21B illustrate an appearance of a mobile phone. The mobile phone has a configuration, for example, in which an upper casing 710 and a lower casing 720 are linked by a connection section (a hinge section) 730, and includes a display 740, a sub-display 750, a picture light 760, and a camera 770. The display 740 or the sub-display 750 is configured of the display device according to the above-described embodiment and so on.

Figure 22A:
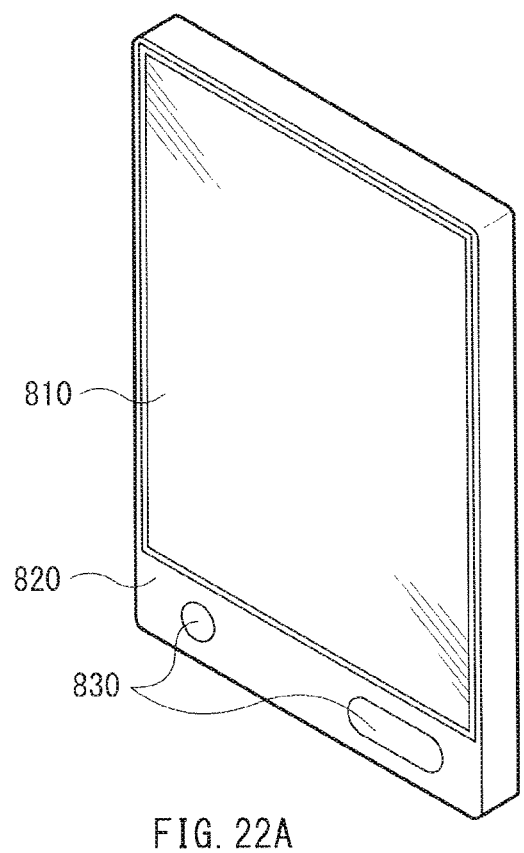
FIG. 22A is a perspective view illustrating a configuration of a smart phone.
Figure 22B:
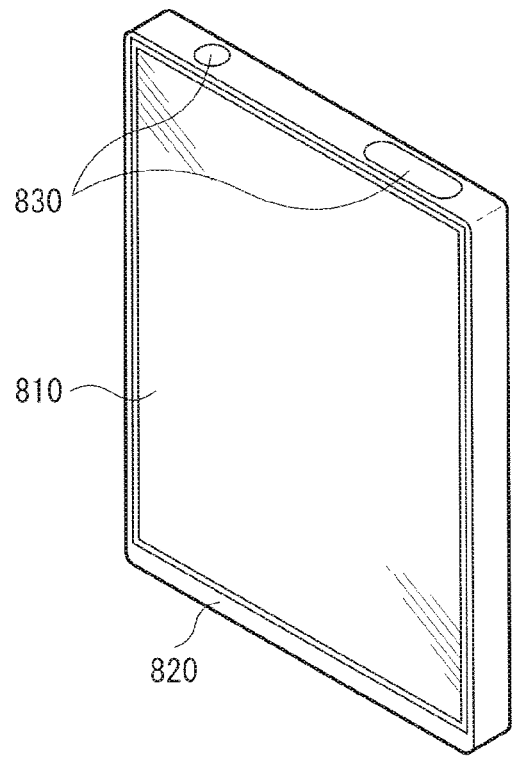
FIG. 22B is a perspective view illustrating a configuration of a smart phone.

FIGS. 22A and 22B illustrates an appearance of a smart phone. The smart phone includes, for example, a display section 810 and a non-display section (a casing) 820, and an operation section 830. The operation section 830 may be provided either on a front face (FIG. 22A) or on a top face (FIG. 22B) of the non-display section 820. The display section 810 is configured of the display device according to the above-described embodiment and so on.

Although description has been made by giving the example embodiment and the modification examples as mentioned above, the contents of the present disclosure are not limited to the above-mentioned embodiments and so forth and may be modified in a variety of ways. For example, although a case that the color filter layers are provided inside the apertures of the black matrix layer has been exemplified in the above-mentioned embodiments and so forth, the color filter layers are not necessarily provided.

Moreover, although a case that the three pixels of R, G, and B (the organic EL elements 10R, 10G, and 10B) are used for subpixels has been exemplified in the above-mentioned embodiments and so forth, the combination of subpixels is not limitative, but a four-pixel configuration in which a white (W) pixel is added may be adopted. In this case, preferably, the light-shielding layer 22 is formed selectively to surround the W pixel, since in the W pixel image quality is easily influenced due to color mixing with other colors.

Further, the material and the thickness of each layer as described in the above-mentioned embodiments and so forth are not limited to as exemplified above, but other materials or other thicknesses may be adopted. In addition, in the display device, it is not necessary to include all the layers described above, and rather a layer or layers other than the above-mentioned layers may be also included. It is to be noted that the effects described in the above-described embodiments and so forth are merely exemplified and not limitative, and the effects of the present disclosure may be other effects or may further include other effects.

It is possible to achieve at least the following configurations from the above-described example embodiments of the disclosure.

(1) A display device, including:
a plurality of pixels that are provided between a first substrate and a light-transparent second substrate, the plurality of pixels each including a light-reflective first electrode, an organic layer, and a light-transparent second electrode in order from the first substrate side, the organic layer including at least a light-emission layer;
a first light-shielding layer that is provided in a region between the plurality of pixels on one side of the second substrate; and
a second light-shielding layer that is provided between the first light-shielding layer and the first substrate, the second light-shielding layer facing at least part of the first light-shielding layer.
(2) The display device according to (1), wherein the second light-shielding layer is formed on the second electrode in a lattice shape.
(3) The display device according to (1), wherein the second light-shielding layer is formed on the second electrode in a stripe shape.
(4) The display device according to any one of (1) to (3),
wherein the plurality of pixels include three or more kinds of pixels that are configured to emit lights of different wavelengths from one another, and
the second light-shielding layer is formed in a region between the pixels that are configured to emit lights of relatively close wavelengths among the three or more kinds of pixels.
(5) The display device according to any one of (1) to (4),
wherein the plurality of pixels include a white pixel that is configured to emit white light, and
the second light-shielding layer is formed to surround the white pixel.
(6) The display device according to any one of (1) to (5), further including a color filter layer, the color filter layer being configured to selectively allow light of specific wavelength to pass through,
wherein the first light-shielding layer includes a plurality of apertures, and
the color filter layer is provided inside the plurality of apertures.
(7) The display device according to any one of (1) to (6), further including a high-resistivity layer that is provided between the organic layer and the second electrode.
(8) The display device according to (7), wherein the second light-shielding layer is provided on the second electrode.
(9) The display device according to (7), wherein the second light-shielding layer is provided between the high-resistivity layer and the second electrode.
(10) The display device according to any one of (1) to (9), wherein the second light-shielding layer includes a conductive material.
(11) The display device according to any one of (1) to (10), wherein the second light-shielding layer is formed by printing.
(12) The display device according to (11), further including an inter-pixel insulating film that is provided with a hole to face the first electrode,
wherein the second light-shielding layer is formed by offset printing utilizing unevenness of a surface of the inter-pixel insulating film.
(13) An electronic apparatus provided with a display device, the display device including:
a plurality of pixels that are provided between a first substrate and a light-transparent second substrate, the plurality of pixels each including a light-reflective first electrode, an organic layer, and a light-transparent second electrode in order from the first substrate side, the organic layer including at least a light-emission layer;
a first light-shielding layer that is provided in a region between the plurality of pixels on one side of the second substrate; and
a second light-shielding layer that is provided between the first light-shielding layer and the first substrate, the second light-shielding layer facing at least part of the first light-shielding layer.

It should be understood by those skilled in the art that various modifications, combinations, sub-combinations and alterations may occur depending on design requirements and other factors insofar as they are within the scope of the appended claims or the equivalents thereof.

What is claimed is:

1. A display device, comprising:
a plurality of pixels that are provided between a first substrate and a light-transparent second substrate, the plurality of pixels each including a light-reflective first electrode, an organic layer, and a light-transparent second electrode in order from the first substrate side, the organic layer including at least a light-emission layer;
a first light-shielding layer that is provided in a region between the plurality of pixels on one side of the second substrate; and
a second light-shielding layer that is provided between the first light-shielding layer and the first substrate, the second light-shielding layer facing at least part of the first light-shielding layer.

2. The display device according to claim 1, wherein the second light-shielding layer is formed on the second electrode in a lattice shape.

3. The display device according to claim 1, wherein the second light-shielding layer is formed on the second electrode in a stripe shape.

4. The display device according to claim 1,
wherein the plurality of pixels include three or more kinds of pixels that are configured to emit lights of different wavelengths from one another, and
the second light-shielding layer is formed in a region between the pixels that are configured to emit lights of relatively close wavelengths among the three or more kinds of pixels.

5. The display device according to claim 1,
wherein the plurality of pixels include a white pixel that is configured to emit white light, and
the second light-shielding layer is formed to surround the white pixel.

6. The display device according to claim 1, further comprising a color filter layer, the color filter layer being configured to selectively allow light of specific wavelength to pass through,
wherein the first light-shielding layer includes a plurality of apertures, and
the color filter layer is provided inside the plurality of apertures.

7. The display device according to claim 1, further comprising a high-resistivity layer that is provided between the organic layer and the second electrode.

8. The display device according to claim 7, wherein the second light-shielding layer is provided on the second electrode.

9. The display device according to claim 7, wherein the second light-shielding layer is provided between the high-resistivity layer and the second electrode.

10. The display device according to claim 1, wherein the second light-shielding layer includes a conductive material.

11. The display device according to claim 1, wherein the second light-shielding layer is formed by printing.

12. The display device according to claim 11, further comprising an inter-pixel insulating film that is provided with a hole to face the first electrode,
wherein the second light-shielding layer is formed by offset printing utilizing unevenness of a surface of the inter-pixel insulating film.

13. An electronic apparatus provided with a display device, the display device comprising:
a plurality of pixels that are provided between a first substrate and a light-transparent second substrate, the plurality of pixels each including a light-reflective first electrode, an organic layer, and a light-transparent second electrode in order from the first substrate side, the organic layer including at least a light-emission layer;
a first light-shielding layer that is provided in a region between the plurality of pixels on one side of the second substrate; and
a second light-shielding layer that is provided between the first light-shielding layer and the first substrate, the second light-shielding layer facing at least part of the first light-shielding layer.

* * * * *